(12) United States Patent
Weis et al.

(10) Patent No.: US 7,569,878 B2
(45) Date of Patent: Aug. 4, 2009

(54) FABRICATING A MEMORY CELL ARRAY

(75) Inventors: Rolf Weis, Dresden (DE); Ulrike Gruening Von Schwerin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 11/220,920

(22) Filed: Sep. 8, 2005

(65) Prior Publication Data

US 2006/0054958 A1 Mar. 16, 2006

(30) Foreign Application Priority Data

Sep. 10, 2004 (DE) .................. 10 2004 043 856

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/301; 257/302; 257/306
(58) Field of Classification Search .................. 257/301, 257/302, 303, 304, 305, 306, 328, 311, 329, 257/135, 242
See application file for complete search history.

(56) References Cited

U.S. PATENT DOCUMENTS

| 6,399,978 | B2 | 6/2002 | Gruening et al. |
| 6,448,610 | B2 | 9/2002 | Weis |
| 6,552,382 | B1 * | 4/2003 | Wu .................. 257/305 |
| 6,767,789 | B1 | 7/2004 | Bronner et al. |
| 2005/0026359 | A1 * | 2/2005 | Voigt et al. .................. 438/243 |

FOREIGN PATENT DOCUMENTS

DE 1011755 C1 5/2002

* cited by examiner

*Primary Examiner*—Chuong A. Luu
(74) *Attorney, Agent, or Firm*—Edell, Shapiro & Finnan, LLC

(57) ABSTRACT

A DRAM memory cell array is fabricated such that, for each memory cell of the array, the gate electrode is initially produced such that it is insulated from all the other gate electrodes assigned to a certain word line, and is only connected to the other gate electrodes assigned to the corresponding word line via the word line in a subsequent step.

23 Claims, 25 Drawing Sheets

FABRICATING A MEMORY CELL ARRAY

CROSS REFERENCE TO RELATED APPLICATIONS

This application claims priority under 35 USC § 119 to German Application No. 10 2004 043 856.0, filed on Sep. 10, 2004, and titled "Method For Fabricating A Memory Cell Array, And Memory Cell Array," the entire contents of which are hereby incorporated by reference.

FIELD OF THE INVENTION

The invention relates to a method for fabricating a memory cell array and to a memory cell array.

BACKGROUND

Memory cells of dynamic random access memories (DRAMs) generally comprise a storage capacitor and a select transistor. An information item in the form of an electric charge which represents a logic 0 or a logic 1 is stored in the storage capacitor. Driving the read or select transistor via a word line allows the information item stored in the storage capacitor to be read via a bit line. The storage capacitor has to have a minimum capacitance if the charge is to be reliably stored and if it is to be possible to distinguish the information item which is read. The lower limit for the capacitance of the storage capacitor is therefore considered to be approximately 25 fF.

FIG. 1 diagrammatically depicts the circuit diagram of a DRAM memory cell 42 having a storage capacitor 9 and a select transistor 10. The select transistor 10 is preferably designed as a normally off n-channel field-effect transistor (FET) and has a first n-doped source/drain electrode 18 and a second n-doped source/drain electrode 19, between which is arranged an active, weakly p-conducting channel region 23. Above the channel region 23 is a gate insulator layer, above which is arranged a gate electrode 17 which can be used to influence the charge density in the conductive channel region 23.

The first source/drain electrode 18 of the select transistor 10 is connected to the second electrode 8 of the plate-type capacitor 9 via a connecting region 21, 43. A first electrode 6 of the storage capacitor 9 is in turn connected to a capacitor plate 55, which is preferably common to all the storage capacitors of a DRAM memory cell array.

The second source/drain region 19 of the select transistor 10 is connected to a bit line 38 via a bit line contact 37. The information stored in the storage capacitor 9 in the form of charges can be written and read via the bit line. A write or read operation is controlled by a word line 33, which is connected to the gate electrode 17 of the select transistor 10, with a current-conducive channel being produced in the conductive channel region 23 between the first source/drain region 18 and the second source/drain region 19 by the application of a voltage. To prevent charging of the semiconductor substrate during the operations of switching the transistor on and off, a substrate terminal 58 is also provided.

Since the storage density is increasing from one memory generation to the next, the surface area required by the single-transistor memory cell needs to be reduced from generation to generation. At the same time, the minimum capacitance of the storage capacitor needs to be maintained.

Up to the 1 MBit generation, both the read transistor and the storage capacitor are realized as planar components. From the 4 MBit memory generation onward, a further reduction in the surface area of the memory cell is achieved by using a three-dimensional arrangement of the storage capacitor. One possible option is to realize the storage capacitor in a trench. In this case, by way of example, a diffusion region which adjoins the wall of the trench and a doped polysilicon filling in the trench act as electrodes of the storage capacitor. The electrodes of the storage capacitor are therefore arranged along the surface of the trench. This increases the effective surface area of the storage capacitor, on which the capacitance is dependent, compared to the space taken up for the storage capacitor at the surface of the substrate, which corresponds to the cross section of the trench. The packing density can be increased further by reducing the cross section of the trench while at the same time increasing its depth.

FIG. 2 shows a diagrammatic cross section through two memory cells each having a trench capacitor. In FIG. 2, a first capacitor electrode 6, which is usually realized by a highly n-doped region, a dielectric layer 7 and a second capacitor electrode 8, which is usually realized as a polysilicon filling, are arranged in a lower trench region. An isolation trench 14 made from $SiO_2$, which is intended to suppress a parasitic transistor which would otherwise form at this location, is formed in an upper trench region. The interior of the trench is in turn filled with an n-doped polysilicon filling. The adjacent capacitor trenches are isolated from one another by an isolation trench 57. The inner capacitor electrode 8 of each trench capacitor is connected to a first n-doped source/drain region 18 of the select transistor via an $n^+$-doped region 21 (buried strap). The second source/drain region 19 is in each case also realized by an n-doped region within the semiconductor substrate and is connected to the associated bit line 38 via a bit line contact 37. A gate electrode 17 comprises a polysilicon layer 17a, a silicide layer 17b (e.g., WSi) and an $Si_3N_4$ layer 17c. The first capacitor electrodes 6 are connected to one another via what is known as a buried plate 55. The substrate terminal 58 is provided by the p-doped region 58. In the illustration shown in FIG. 2, the select transistor 10 is designed as a planar select transistor in the substrate surface 1, in which the current flows in the horizontal direction between the first and second source/drain regions 18, 19.

Furthermore, the storage capacitor may be formed as a stacked capacitor on the substrate surface 1.

Given the ever smaller surface areas of the memory cells caused by increasing miniaturization, maintaining the current driver capacity of the transistor represents an increasing problem. The term current driver capacity of the transistor is to be understood as meaning the ability of the transistor to deliver a sufficient current to charge the storage capacitor quickly at a predetermined source/drain potential and a predetermined gate voltage. However, the reduction in the size of the cell surface areas and the resultant reduction in the transistor dimensions reduce the transistor width of the planar surface transistors. This in turn leads to a reduction in the current which is connected through from the transistor to the storage capacitor.

One possible short-channel surface transistor concept which can be used to solve this problem is what is known as the double-gate transistor, in which the channel region between source and drain regions is surrounded by a gate electrode on at least two sides, with the result that a high current driver capacity can be achieved even with very short channel lengths, since the channel width is increased compared to conventional planar select transistors. In this case, it is preferable for the double-gate transistor to be designed as what is known as a fin-FET, in which the channel region is designed in the form of a fin between the source and drain regions and the channel region is surrounded by the gate electrode at least on the two opposite sides. Given a suitable configuration of the fin width and therefore of the channel width, a fin-FET of this type can be operated in such a way that in the connected-through state with a gate electrode voltage applied, the two inversion layers which form beneath the gate electrodes overlap, and consequently a complete charge carrier inversion takes place, with the result that the entire channel width can be used to carry current. Furthermore, with fin-FETs, there is the possibility of using the gate potential to directly control what are known as the short-channel effects, which occur with very short channel lengths and can lead to a change in the threshold voltage of the transistor. Furthermore, fin-FETs are distinguished by a high subthreshold swing and therefore good switch-on and switch-off properties combined, at the same time, with a reduced subthreshold leakage current.

When fabricating the memory cell shown in FIG. 2, it is usual for the gate electrodes 17 and the word lines to be produced in one step from one material and at the same vertical distance from the substrate surface. Accordingly, passive word lines (passing word lines, PWLs) 56, which in each case act as gate electrodes in the select transistors located in the plane behind the two trench capacitors, are in each case arranged above the two trench capacitors 9. Conversely, the gate electrodes 17 shown in the select transistor 10 of the present plane are what are known as active word lines, whereas in the memory cells of the plane behind they act as passive word lines. More accurately, in a cross section arranged behind the plane of the drawing illustrated, they run directly over the trench capacitors 8 behind.

Passive word lines of this type are disadvantageous in that they prevent access to the trench capacitors after the latter have been formed, making it in particular impossible to realize the contact between second capacitor electrode and first source/drain region 18 as a surface terminal. As shown in FIG. 2, this terminal 21 is realized as a buried strap, i.e. a doped region buried in the substrate, which can result, for example, in problems with out diffusion of the doped regions. Furthermore, there has to be a minimum distance between the highly doped regions 21 and 18 in order to minimize the extent to which these regions influence one another. Finally, a buried strap terminal is more complex to produce.

A further drawback of the passive word lines 6 arranged above the trench capacitors 8 is that it is necessary to avoid a short circuit between the corresponding polysilicon layers 17a and the n⁺-doped region 22 below. These drawbacks in particular make further miniaturization of the memory cell difficult.

SUMMARY

In light of the above, an object of the present invention is to provide an improved memory cell array and an improved method for fabricating a memory cell array.

These and other objects are achieved in accordance with the present invention, by providing a method for fabricating a memory cell array. The memory cell array includes a plurality of memory cells at least partially formed in a semiconductor substrate, each memory cell comprising a storage capacitor to store electric charge and a select transistor to drive the storage capacitor, a plurality of word lines arranged in a first direction, and bit lines arranged in a second direction intersecting the first direction. The method comprises:

forming at least a first capacitor electrode, a storage dielectric and a second capacitor electrode of the storage capacitor;

forming at least one gate electrode from an electrically conductive gate material, a first source/drain region and a second source/drain region of the select transistor, such that the second capacitor electrode of the storage capacitor is connected to the first source/drain region of the select transistor, and the first and second source/drain regions are connected to one another via a channel region arranged in the semiconductor substrate, and the at least one gate electrode is arranged adjacent to and electrically insulated from the channel region;

providing a plurality of word lines formed from an electrically conductive material, wherein each word line is connected to a plurality of gate electrodes, with each gate electrode being assigned to memory cells arranged along the first direction, such that each word line drives the gate electrodes connected to the word line so as to trigger a read operation;

providing bit line contacts to connect each second source/drain region of a select transistor to a corresponding bit line;

providing a plurality of bit lines formed from an electrically conductive material, the bit lines being configured to transmit an electric charge that has been read;

wherein, for each memory cell, the at least one gate electrode is initially produced such that the at least one gate electrode is insulated from all the other gate electrodes assigned to the corresponding word line and is only connected to the other gate electrodes assigned to the corresponding word line via the corresponding word line; and wherein, if the storage capacitor is designed as a trench capacitor in a capacitor trench formed in the semiconductor substrate, the at least one gate electrode is formed outside the capacitor trench.

According to the present invention, therefore, it is provided that the step of forming the gate electrodes and the word lines is divided into two separate steps, which do not necessarily have to be carried out in succession. This division provides firstly for the gate electrodes for the corresponding select transistors to be formed in a first step; these gate electrodes are electrically insulated from one another following this step; and for a wiring level to be produced in a later step, so as to form a plurality of word lines and to connect the gate electrodes associated with a word line to one another. In particular if the storage capacitor is designed as a trench capacitor, in which the first and second capacitor electrodes and the capacitor dielectric are arranged or provided in a capacitor trench, the gate electrode is formed outside the capacitor trench. In the case of the standard memory cell layouts with a planar select transistor, the select transistor is formed laterally adjacent to the trench capacitor, and consequently this requirement is satisfied. As a result, in the finished memory cell array, if the storage capacitor is designed as a trench capacitor, the gate electrode is arranged outside the capacitor trench.

Consequently, the trench capacitor, which in a conventional forming sequence is covered by a passive word line after the gate electrode has been formed, remains accessible even after the gate electrode has been formed, so that, for example, it is possible to provide a surface terminal on the second capacitor electrode. A further advantage is that the material of the gate electrodes may differ from the material of the word lines and that, for example, the word lines can be made wider than the associated gate electrodes.

As a further advantage, the word lines can be configured independently of the gate electrodes depending on the requirements in terms of material or dimensions. Examples of materials for the gate electrodes include in particular polysilicon, titanium nitride or other metal compounds or metals, while examples for the word lines include metals, in particular refractory metals, metal compounds, refractory metal compounds, in particular tungsten, WSi or other metal silicides, Ti, TiN, Mo, Ru or Al, or also polysilicon. The word lines may also have a larger cross section than the gate electrodes, so that the resistance of the word lines can be reduced while the gate electrodes take up the same amount of space.

The geometric arrangement of the memory cells and in particular of storage capacitor and select transistor can take any desired form. By way of example, the memory cells can be each arranged in cell rows and cell columns, and the storage capacitors and select transistors can be arranged in the form of a checkerboard pattern, with the select transistors each being assigned to diagonally adjacent first fields and the storage capacitors each being assigned to intervening and diagonally adjacent second fields.

Alternatively, it is also possible to provide an arrangement that is similar to that shown in FIG. 2. In this case, in each case two trench capacitors are arranged adjacent to one another, and next to two trench capacitors in turn two select transistors are arranged adjacent to one another. The arrangement of in each case two trench capacitors and two select transistors is arranged offset with respect to one another. Furthermore, the storage capacitor can be configured in any desired way, for example as a trench capacitor or as a stacked capacitor.

According to a preferred embodiment of the present invention, the gate electrode material can be applied over the entire surface and then patterned. Alternatively, however, it is also possible first of all to apply a layer of an auxiliary material, to etch the region in the auxiliary material which is assigned to the gate electrode and then to introduce the gate material in the etched region.

Similarly, the step of forming the word lines may in particular also comprise application of the layer of the word line material over the entire surface followed by patterning of the word lines; alternatively, however, it is also possible first of all to apply a layer of an auxiliary material, to etch the regions in the auxiliary material assigned to the word lines and then to introduce the conductive word line material into the etched regions.

One particular advantage ensues with the method according to the invention if the word lines are only provided after the step of forming the first and second source/drain regions. In this case, large areas of the substrate surface are freely accessible and not yet covered with word lines, which makes it easier to form the source/drain regions.

Furthermore, it is preferable for the first and second source/drain regions in each case to be designed in such a manner that the flow of current through the conductive channel region is substantially horizontal. In this context, the term "substantially horizontally" means that the length of the conducting channel in the horizontal direction is greater than the length of the conducting channel in the vertical direction. By way of example, the transistor may be formed as a planar select transistor.

Furthermore, according to the present invention, it is particularly preferable for the forming of the select transistor to comprise the production of a fin-like semiconductor substrate region in which the conductive channel region is formed. As a result, in particular the select transistor can be formed as a fin-FET, in which the gate electrode surrounds the channel region on at least two opposite sides and is particularly preferably substantially U-shaped in cross section. This makes it possible in particular to achieve the advantages of the fin-FET which have been explained above and results in the additional benefit that it is possible to effectively avoid short circuits between adjacent word lines, since the gate electrode of the fin-FET, which surrounds the channel region on at least two opposite sides, is arranged at a different vertical distance from the substrate surface than the adjacent word lines.

Furthermore, in accordance with the invention, it is particularly preferred for the second capacitor electrode and the first source/drain region of the select transistor to be connected to one another via a connecting region arranged above the surface of the semiconductor substrate. It is in this way also possible, for example, for the source/drain regions of the select transistor to be formed above the substrate surface, with the result that the effective channel length can be increased for the same typical dimensions within the memory cell.

Due to the gate electrodes and the associated word lines being produced in separate steps and using different masks and the gate electrodes initially being formed insulated from one another and only being connected to one another via the word lines at a later stage, the bottom edge of the gate electrode, as seen in cross section along the conductive channel region, is in each case arranged at a different height from the bottom edge of the word lines. This height is in this context measured perpendicular to the substrate surface, i.e. denotes a vertical distance from the substrate surface. If in particular a cross section which connects the first and second source/drain regions to one another is taken, the bottom edge of the gate electrode is arranged at a different height from the bottom edge of the word line, and the bottom edge of the gate electrode is in particular at a shorter vertical distance from the substrate surface than the bottom edge of the word line. The term "substrate surface" denotes the surface of the semiconductor wafer at the start of processing.

When considered from a different perspective, the word lines have a base layer and a connecting layer. The base layer is interrupted; it is present in the active sections of the word lines and absent in the passive sections of the word lines. More accurately, the sections of the base layer in each case correspond to the gate electrodes while the connecting layer connects the gate electrodes assigned to a word line to one another.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIGS. 1-10 depict steps for fabricating a memory cell array in accordance with a first exemplary embodiment of the present invention, where FIGS. 3A, 4A, 5, 6A, 7, 8 and 9A depict cross-sectional views and FIGS. 3B, 4B, 4C, 6B, 9B and 10 depict plan views of the memory cell array being formed at different processing steps.

FIG. 11 depicts a plan view, and FIGS. 12-21 depict cross-sectional views of the memory cell array taken along lines III-IV, IV-V and V-VI of FIG. 11 and showing the formation of the memory cell array at different processing steps.

DETAILED DESCRIPTION

FIGS. 3A to 10 illustrate a first exemplary embodiment of the present invention, in which a storage capacitor is formed as a trench capacitor and is connected to a planar select transistor via a buried strap connection 21. In addition, the memory cells are arranged in the form of a checkerboard pattern, in which trench capacitors and select transistors are assigned to diagonally adjacent fields. However, it is noted that it is also possible to select any other desired configurations of the components and in particular also a different form of the memory cell array.

Figure 1:
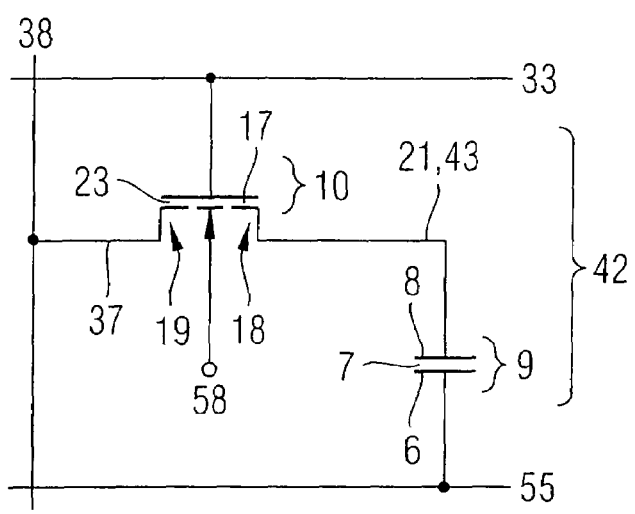
FIG. 1 deicts a circuit diagram of a DRAM memory cell.
Figure 2:
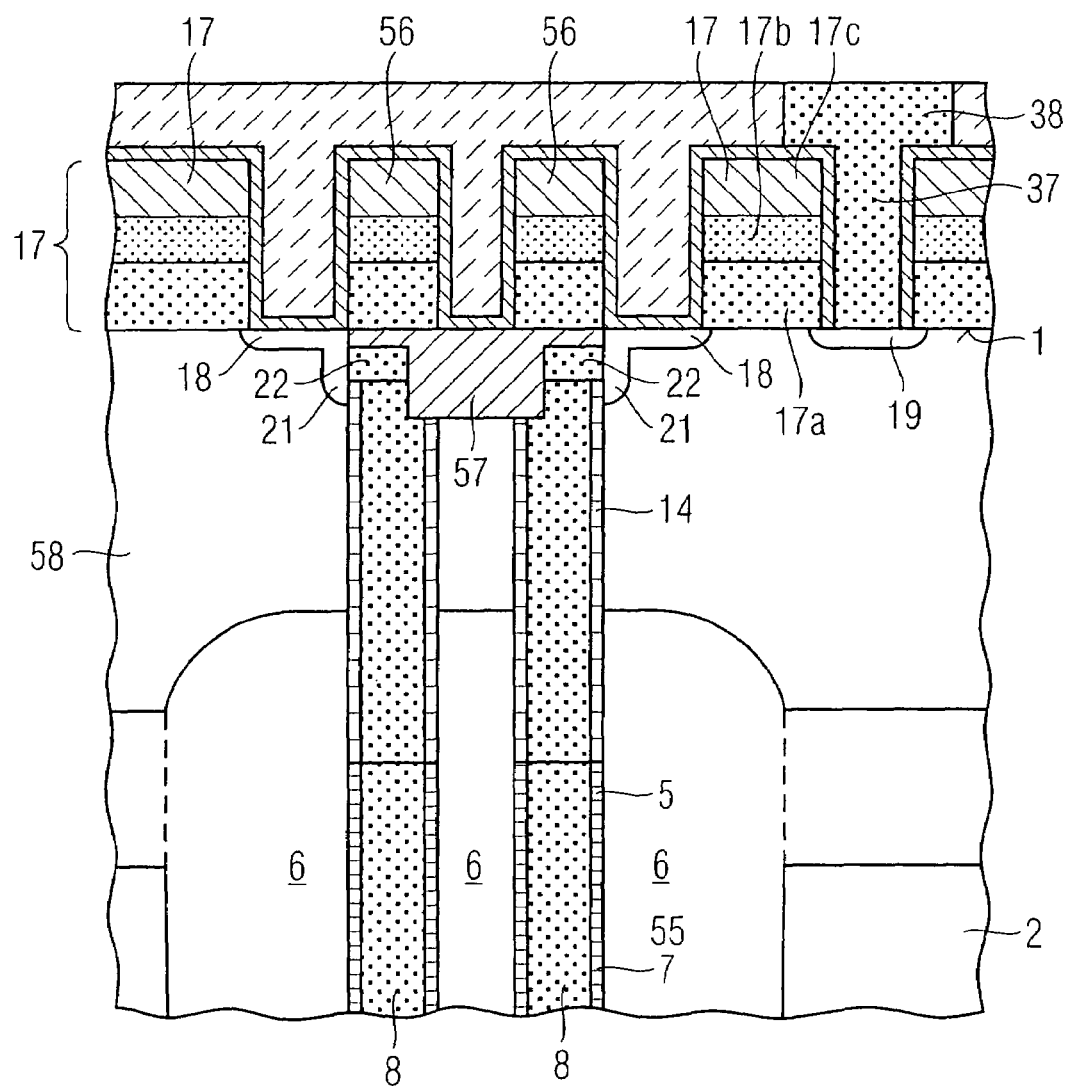
FIG. 2 depicts a cross-sectional view of a conventional memory cell array.
Figure 3A:
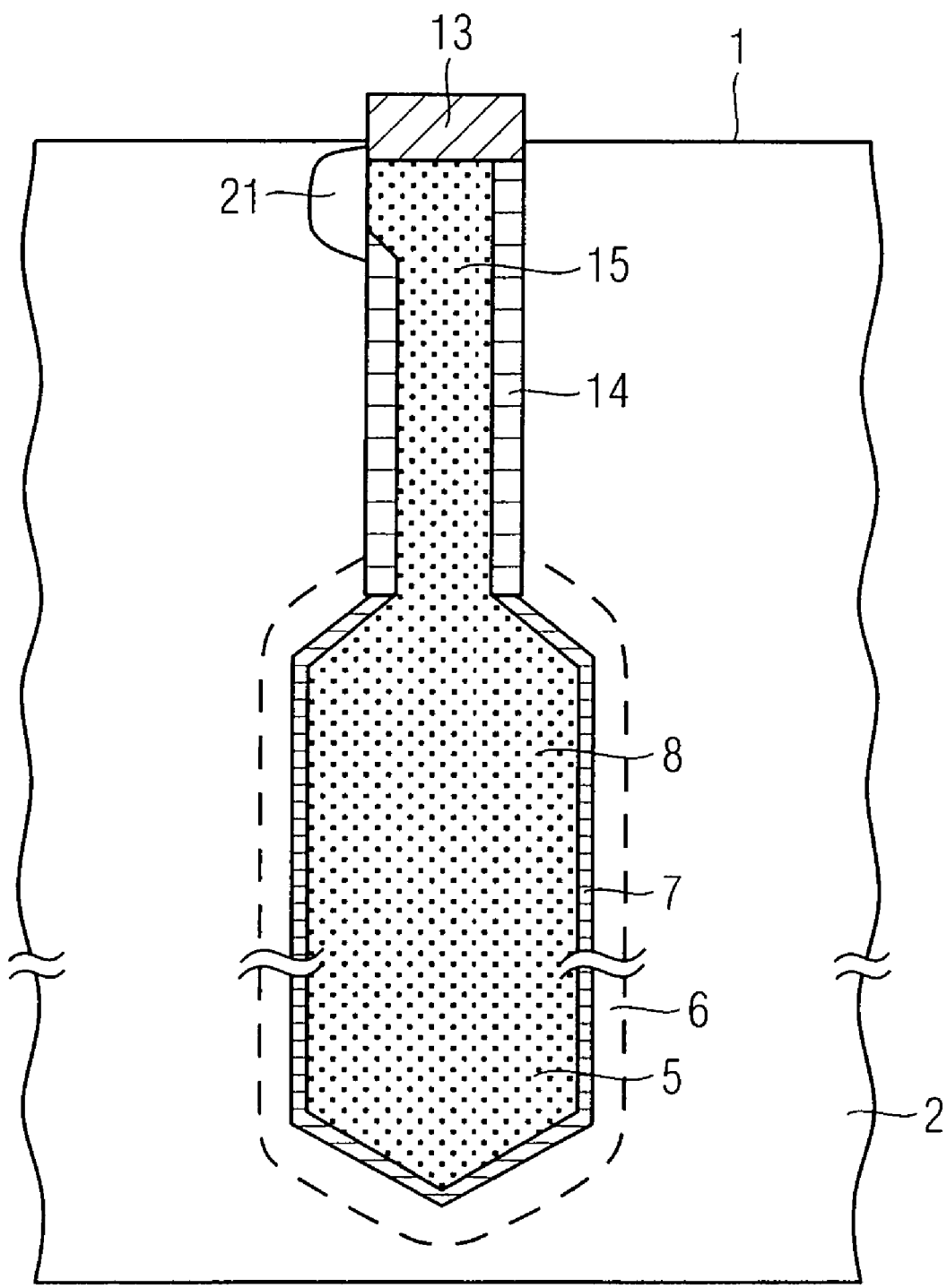

FIG. 3A depicts a storage capacitor that is arranged in a trench 5 formed in a semiconductor substrate. The depth of the trench is from 6 μm to 7 μm, and the distance from the substrate surface 1 to the widened region of the trench is 1 μm. The upper diameter of the trench is approximately 100 nm, while the lower trench diameter is 120 to 130 nm. A capacitor dielectric 7 and a polysilicon filling 8 as second capacitor electrode are arranged in the lower trench region, which has been widened by a conventional wet bottle widening process. The first capacitor electrode 6 is formed by an n$^+$-doped region.

An insulation collar 14 for disconnecting a parasitic transistor which would otherwise form at this location is provided in the upper trench region and is open on one side, in order to facilitate a connection of the second capacitor electrode 8 to the n$^+$-doped region 21, which acts as a buried strap. The buried strap region 21 is arranged approximately 30 to 120 nm below the substrate surface 1. A polysilicon filling 15 is likewise provided in the upper region of the capacitor trench 5, but this filling may also be composed of a different material and may in particular also have a different, suitable doping from the second capacitor electrode 8. The trench capacitor is insulated at the top by an insulation layer.

Figure 3B:
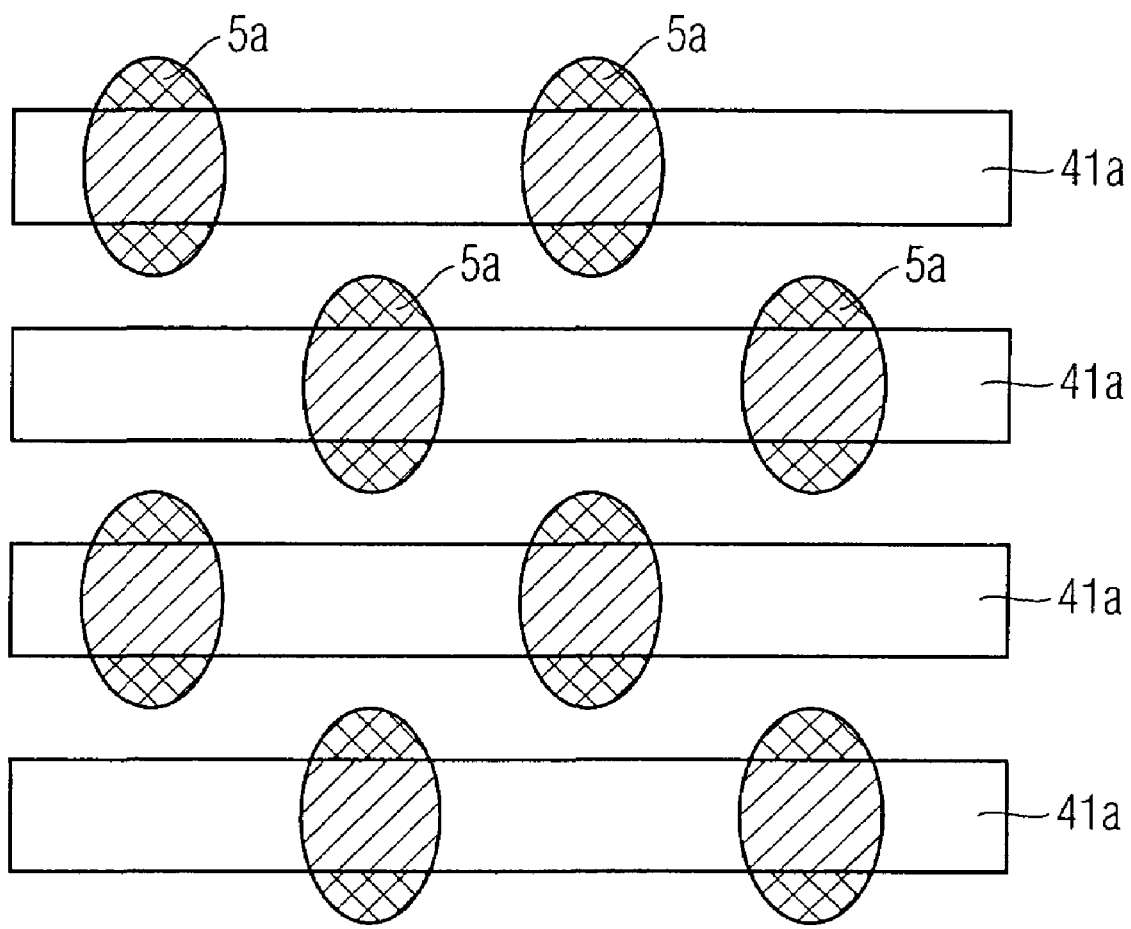

FIG. 3B illustrates a plan view of an array of capacitor trenches, as shown in FIG. 3A, with defined active areas 41$a$, prior to the etching of the insulation structures which lie between the active areas. As can be seen from FIG. 3B, defined regions 5A for the trenches belonging to the memory cells are arranged offset with respect to one another. The defined active areas 41$a$ are arranged in strip form, in such a manner that they in each case run through the centre of the defined trench regions.

The width of the active areas corresponds to the feature size F which is typical of the particular technology, and in the present case is 100 nm or 80 nm. To further define the active areas, the insulation structures between them are etched down to a depth of approximately 300 nm below the substrate surface.

In a subsequent step, the gate electrodes 17 for the select transistors are provided. In this embodiment, the gate electrodes are provided by applying the corresponding material over the entire surface and then patterning it. More accurately, a polysilicon layer is deposited, and then a Si$_3$N$_4$ layer is deposited on top of it, and these layers are then patterned, so as to ultimately produce the gate stack comprising gate electrode material 17 and Si$_3$N$_4$ layer 29 illustrated in FIG. 4A.

Two method variants are conceivable for the patterning of the gate electrode. The gate electrode regions 26 can be formed as oval regions, as illustrated in FIG. 4B, or alternatively the gate electrode regions can initially be formed as gate electrode strips 30, which are isolated from one another by interruption regions 31. This is illustrated in FIG. 4C. The procedure for forming the gate electrodes which is illustrated with reference to FIG. 4B is more advantageous, since only one mask step is required, whereas the procedure shown in FIG. 4C requires two mask steps. However, the procedure illustrated in FIG. 4C has the advantage that the line width (CD, critical dimension) can be better controlled, since the gate electrodes are initially each defined in strip form.

FIG. 4B shows the arrangement of defined capacitor trenches 5A defined active areas 41A, with insulation structures 16 being located between the active areas, and the defined gate regions 26. As can be seen, the defined gate regions 26 are oval in form and arranged between two adjacent capacitor trenches.

By contrast, the gate electrode strips 30 shown in FIG. 4C are arranged perpendicular to the active areas 41$a$ and the insulation structures 16 located between the active areas, and are further isolated from one another by oval interruption regions 31. The interruption regions 31 are oriented in such a manner that they lie above the capacitor trenches. Accordingly, the gate electrode strips 30 are arranged between two adjacent capacitor trenches.

Figure 4A:
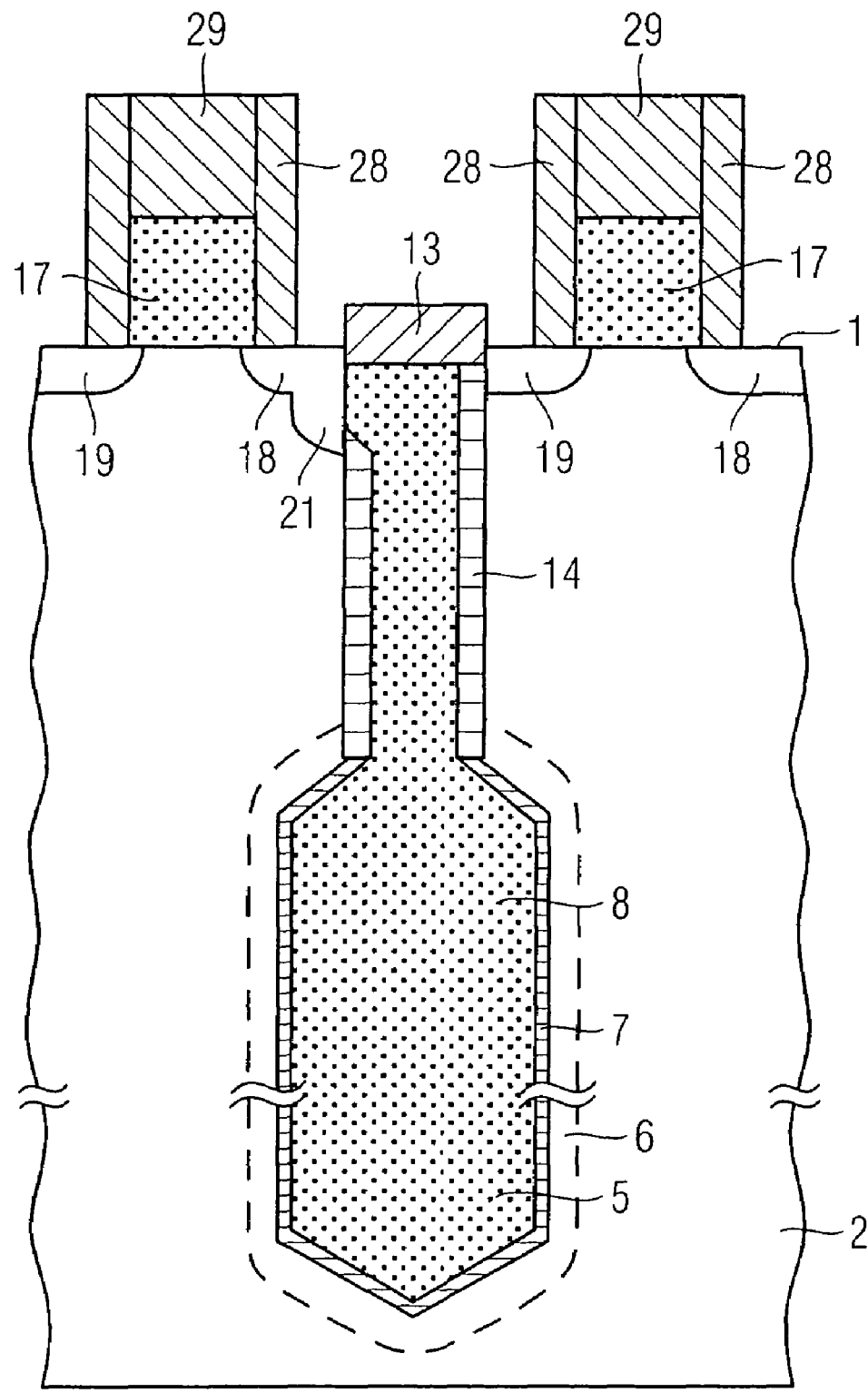
Figure 4B:
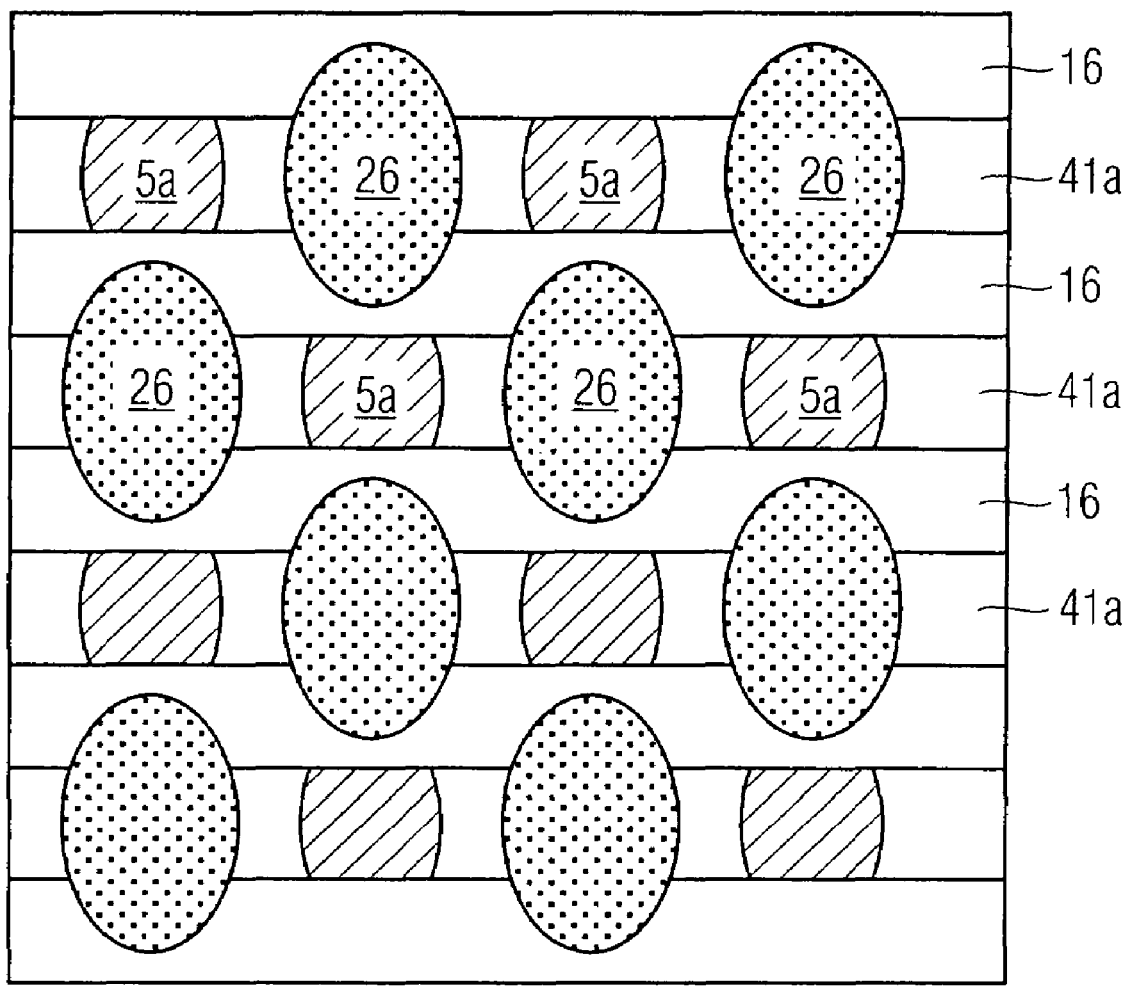
Figure 4C:
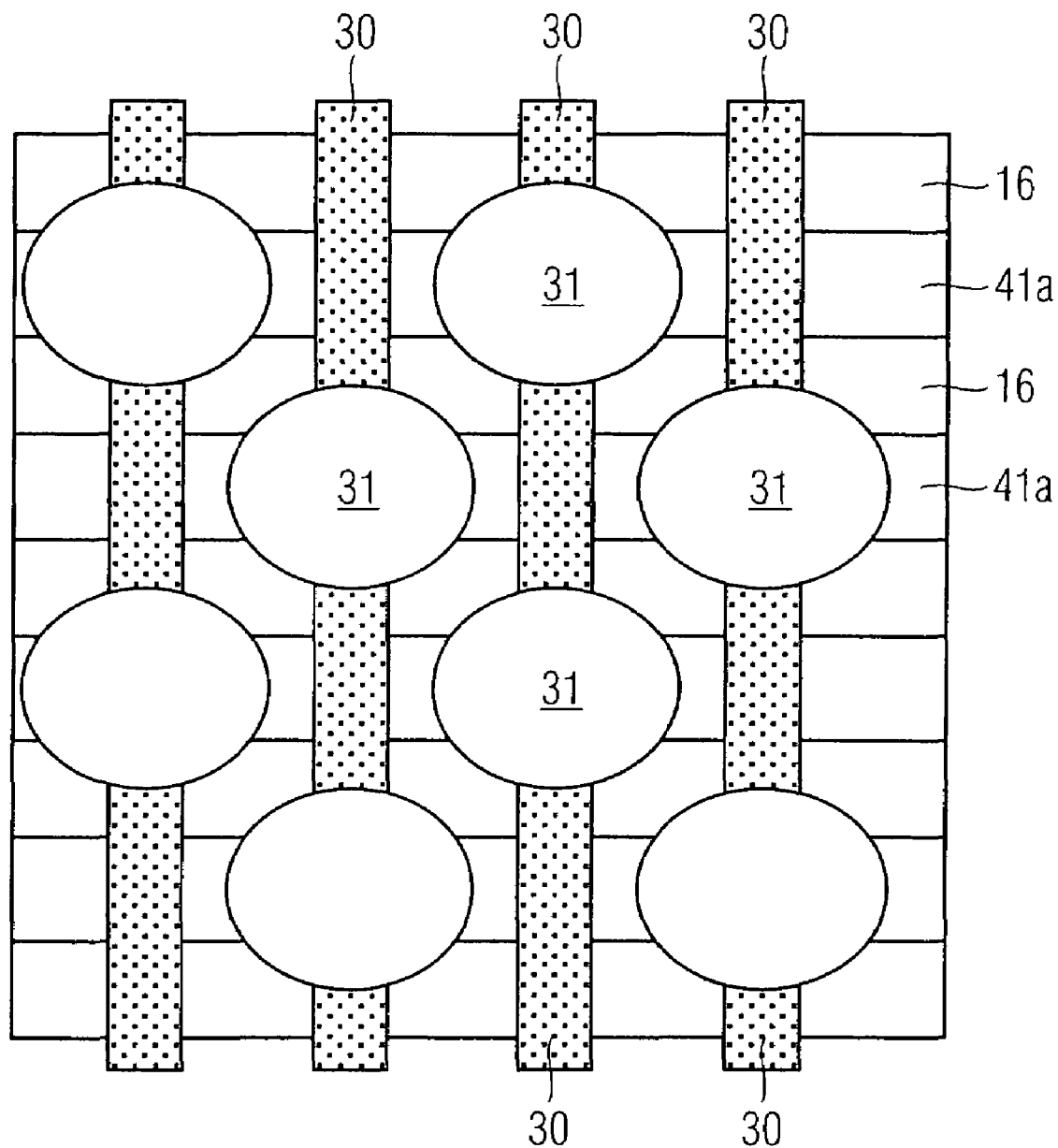
Figure 5:
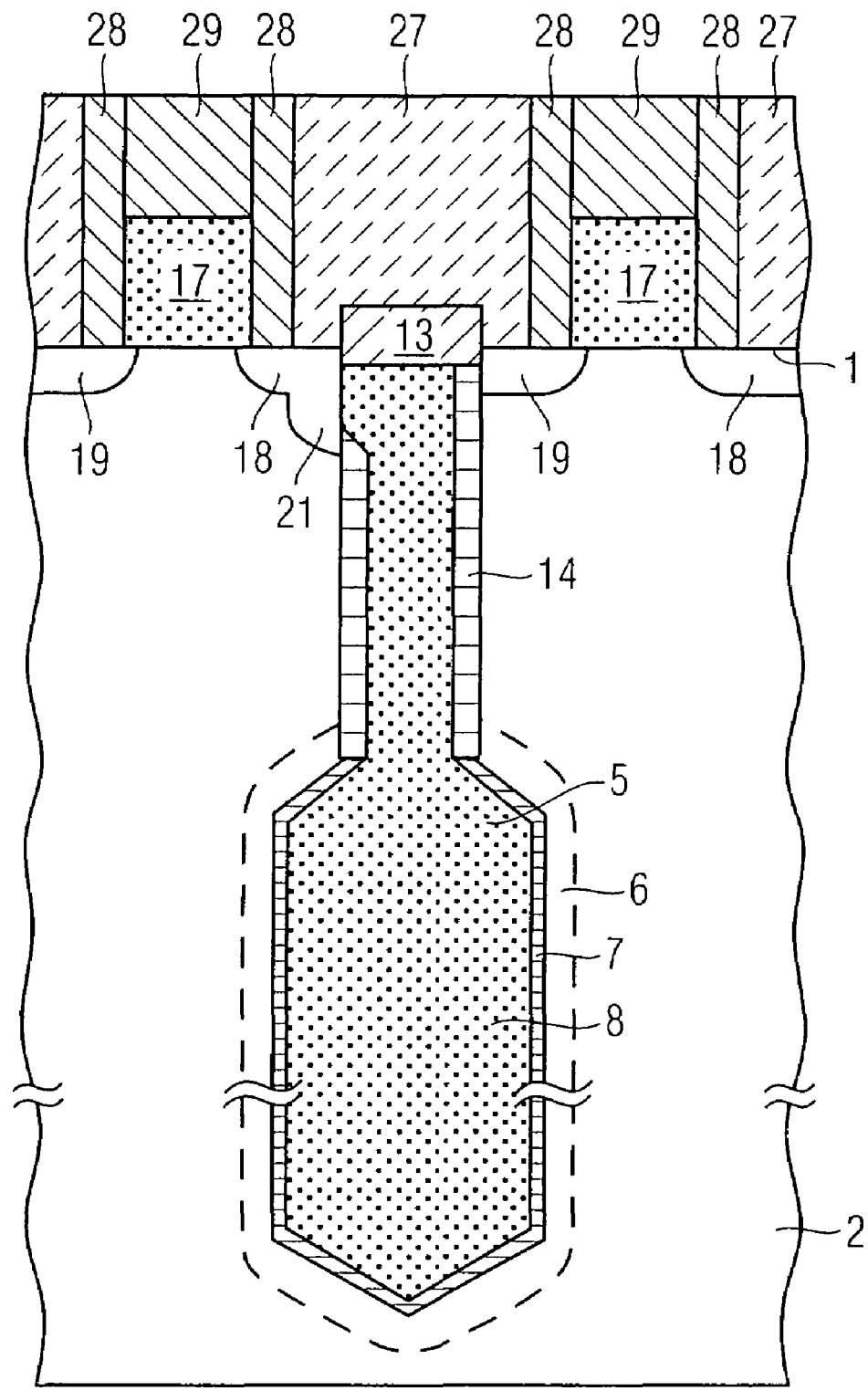

As is also illustrated in FIG. 4A, side wall oxidation is carried out after the gate electrodes 17 have been defined using known methods. Then, the first and second source/drain regions 18 and 19 are defined by doping using an ion implantation process, and then an Si$_3$N$_4$ spacer 28 is deposited. Next, a BPSG layer 27 is deposited and planarized by a CMP (chemical mechanical polishing) process. The resultant structure is shown in FIG. 5.

Figure 6A:
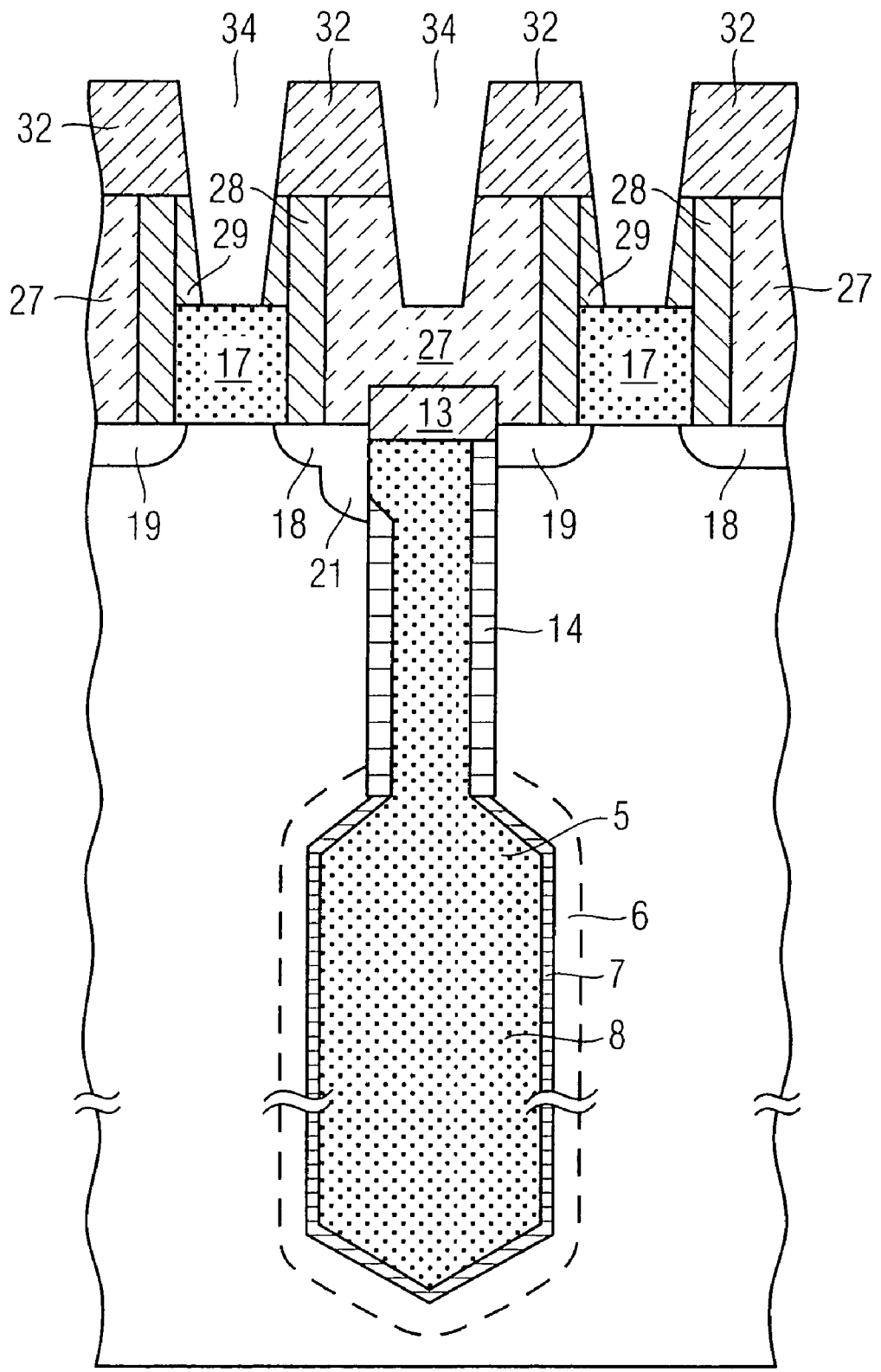

As shown in FIG. 6A, an SiO$_2$ layer 32 is then deposited by a TEOS process, and the regions in which the word lines are to be formed are defined photolithographically using a suitable mask and then etched. As further shown in FIG. 6A, the regions for the word lines 34 are etched to a depth such that the word lines contact-connect the gate electrodes 17. In particular, the regions 34 extend down to a depth which is significantly greater than with conventional memory cell arrays. Specifically, in conventional memory cell arrays, the word lines run at the level of the gate electrodes 17.

Figure 6B:
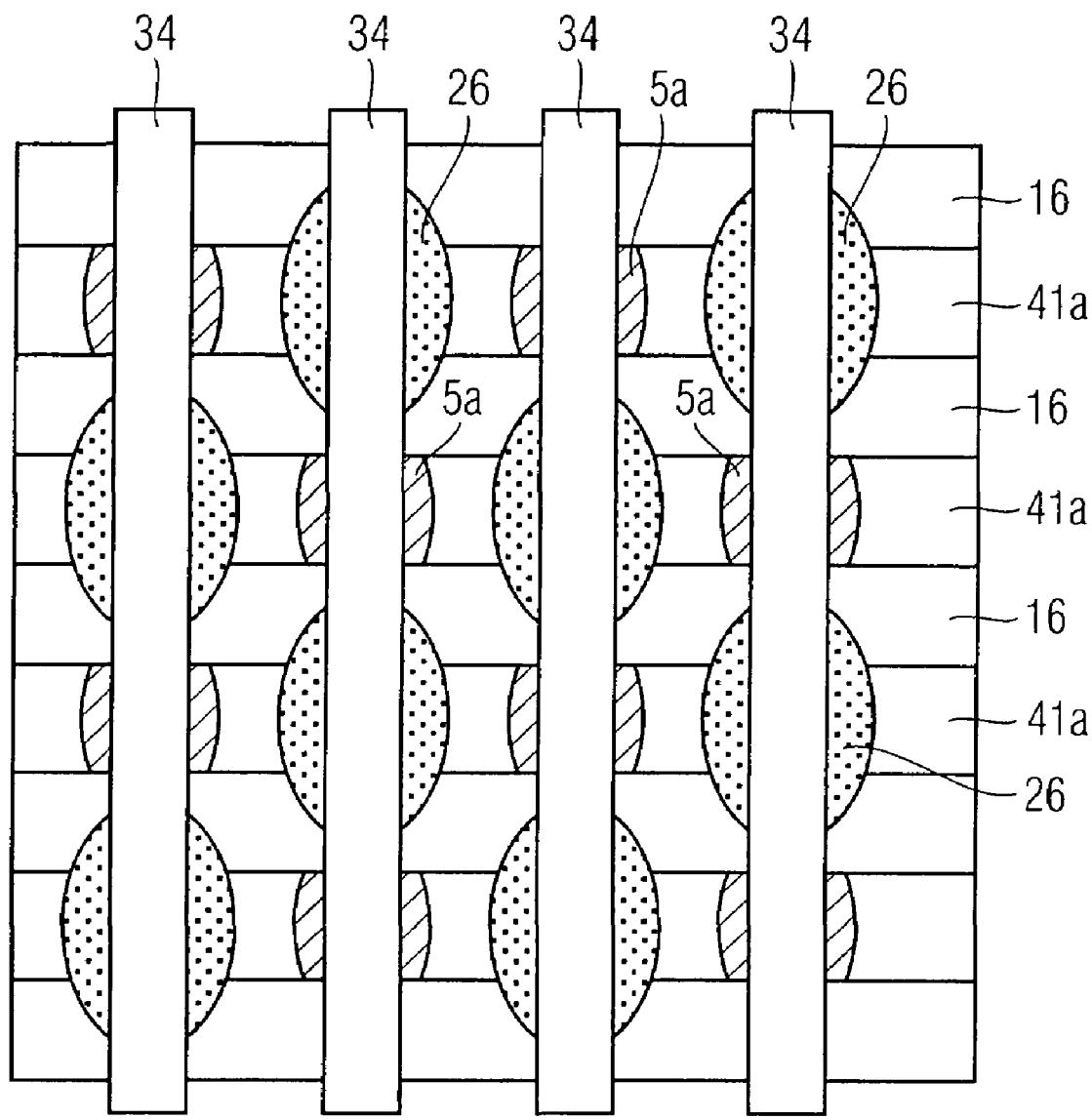
Figure 7:
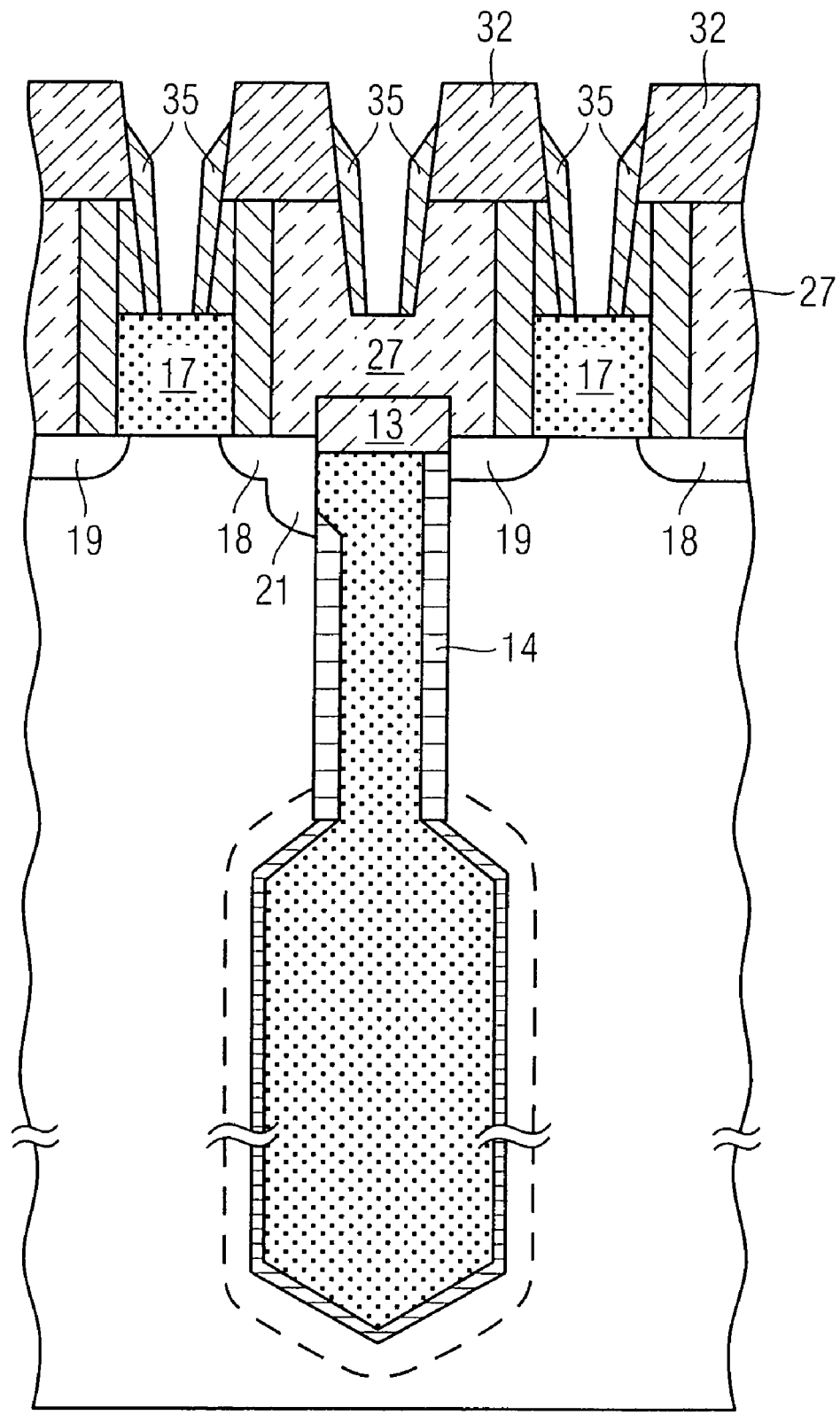
Figure 8:
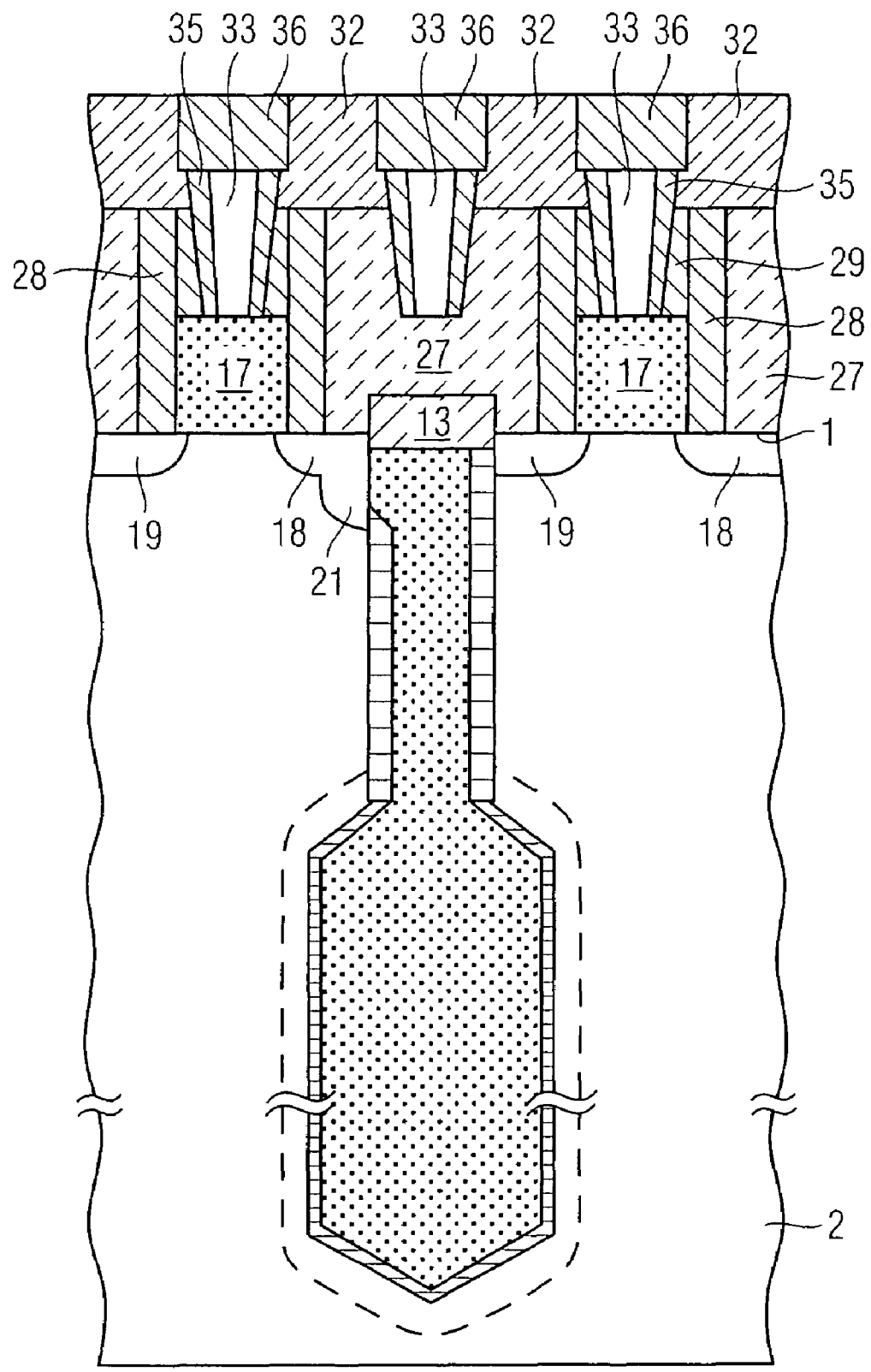

FIG. 6B illustrates a plan view of the resulting memory cell array. The defined word line regions run above the regions for the gate electrodes. In a subsequent step, an Si$_3$N$_4$ spacer layer 35 is defined and then etched using known processes, so that the Si$_3$N$_4$ spacers remain only in the defined word line regions 34. The result is the structure shown in FIG. 7. Then, a suitable metal for the word lines is introduced, optionally with the provision of a liner layer. Suitable metal fillings comprise in particular tungsten, but also other metals which are customarily used for low-resistance metal lines. The layer of metal lines deposited is etched back and the space which remains is filled with an Si$_3$N$_4$ layer 36 using known processes. This is followed by a planarization step. The result is the structure shown in FIG. 8.

Figure 9A:
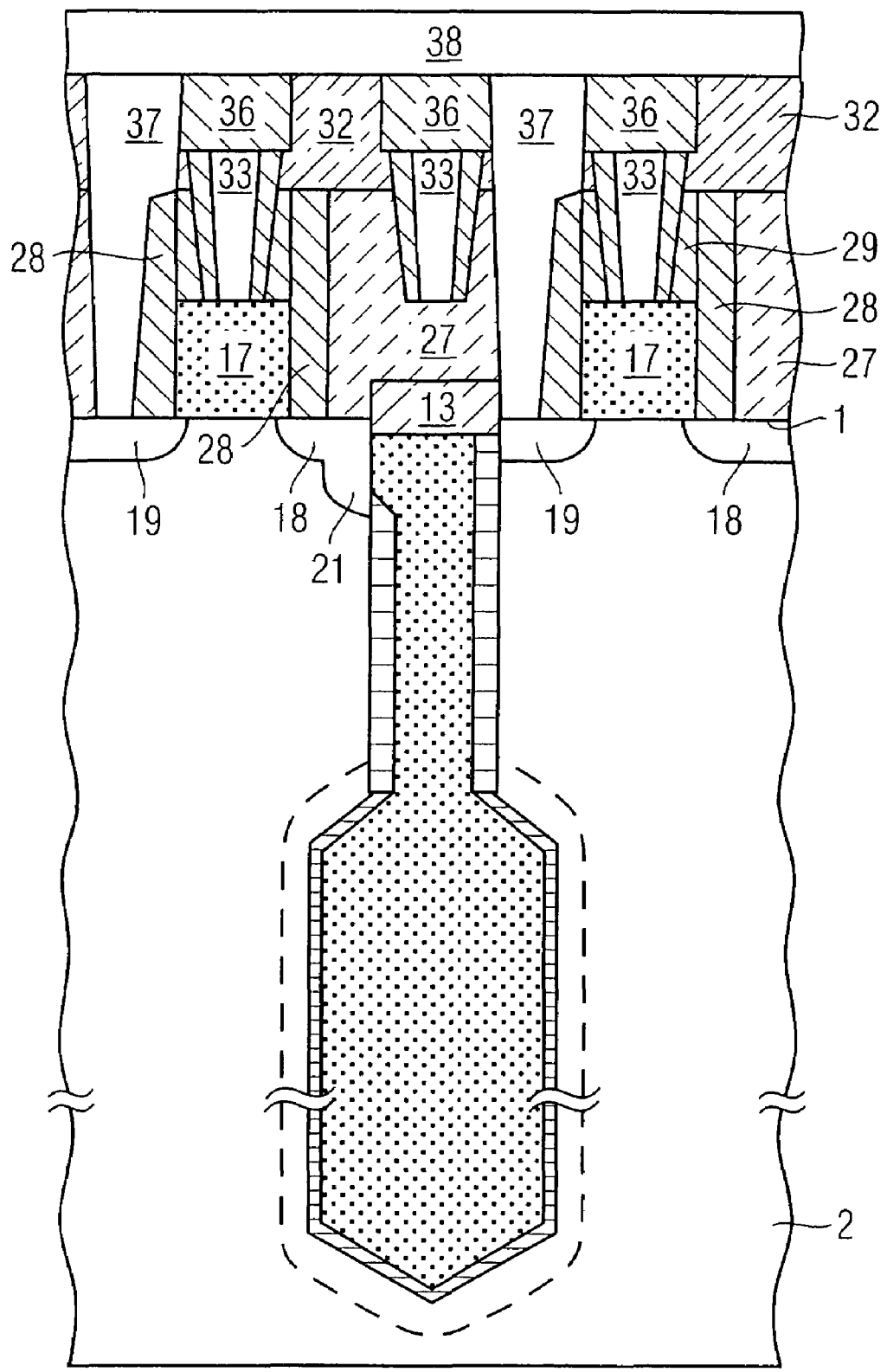
Figure 9B:
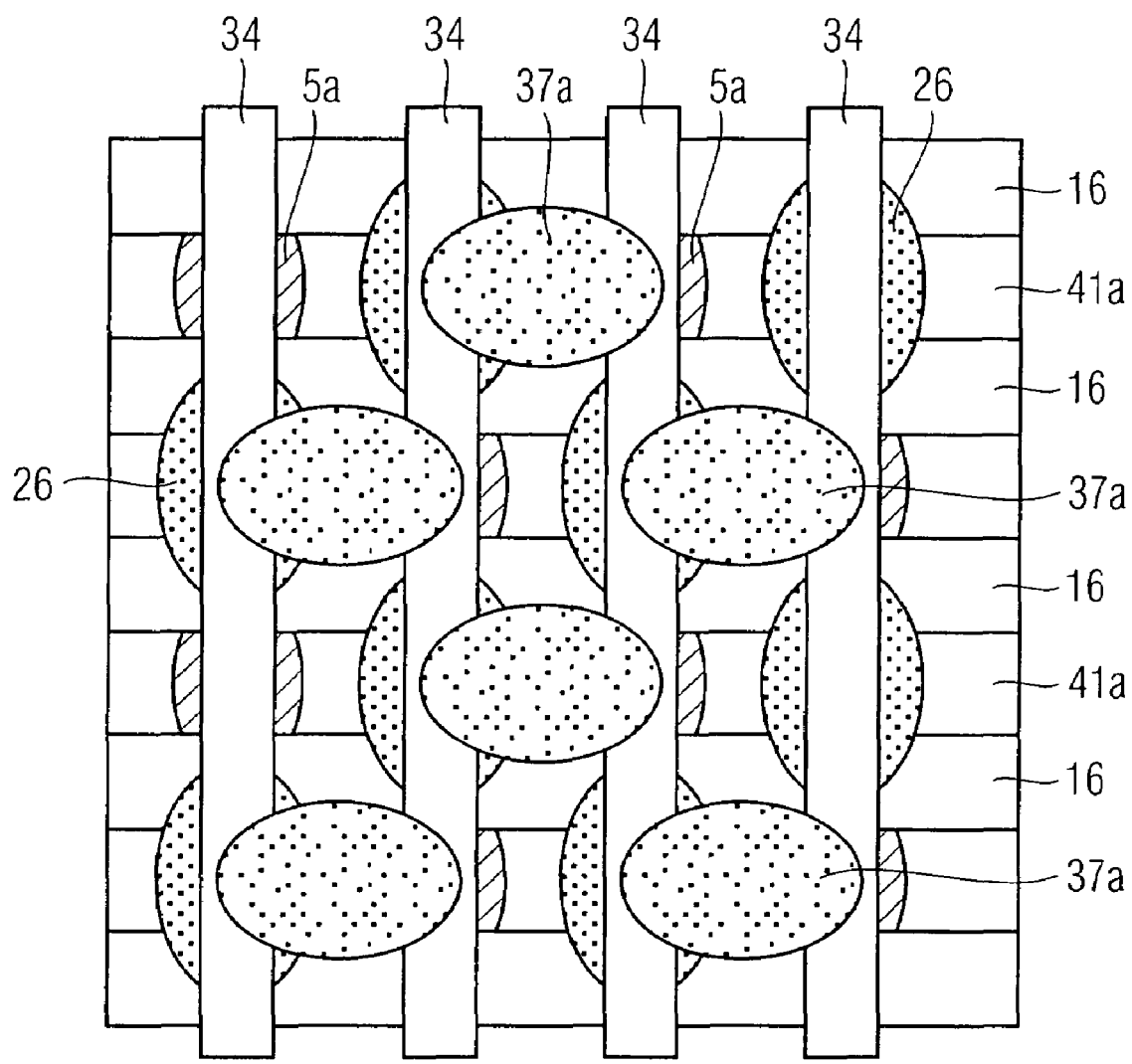

In a subsequent step, the bit line contacts 37 are defined by photolithographic patterning using known processes and subsequent etching. Then, the material for the bit line contacts, for example tungsten, is deposited and the resulting surface is planarized. Then, the M0 metallization level is produced using known processes, in particular by depositing a bit line layer and etching the bit line 38. The result is the structure shown in FIG. 9A. FIG. 9B illustrates a plan view of the resulting memory cell array after the bit line contacts 37$a$ have been defined.

Figure 10:
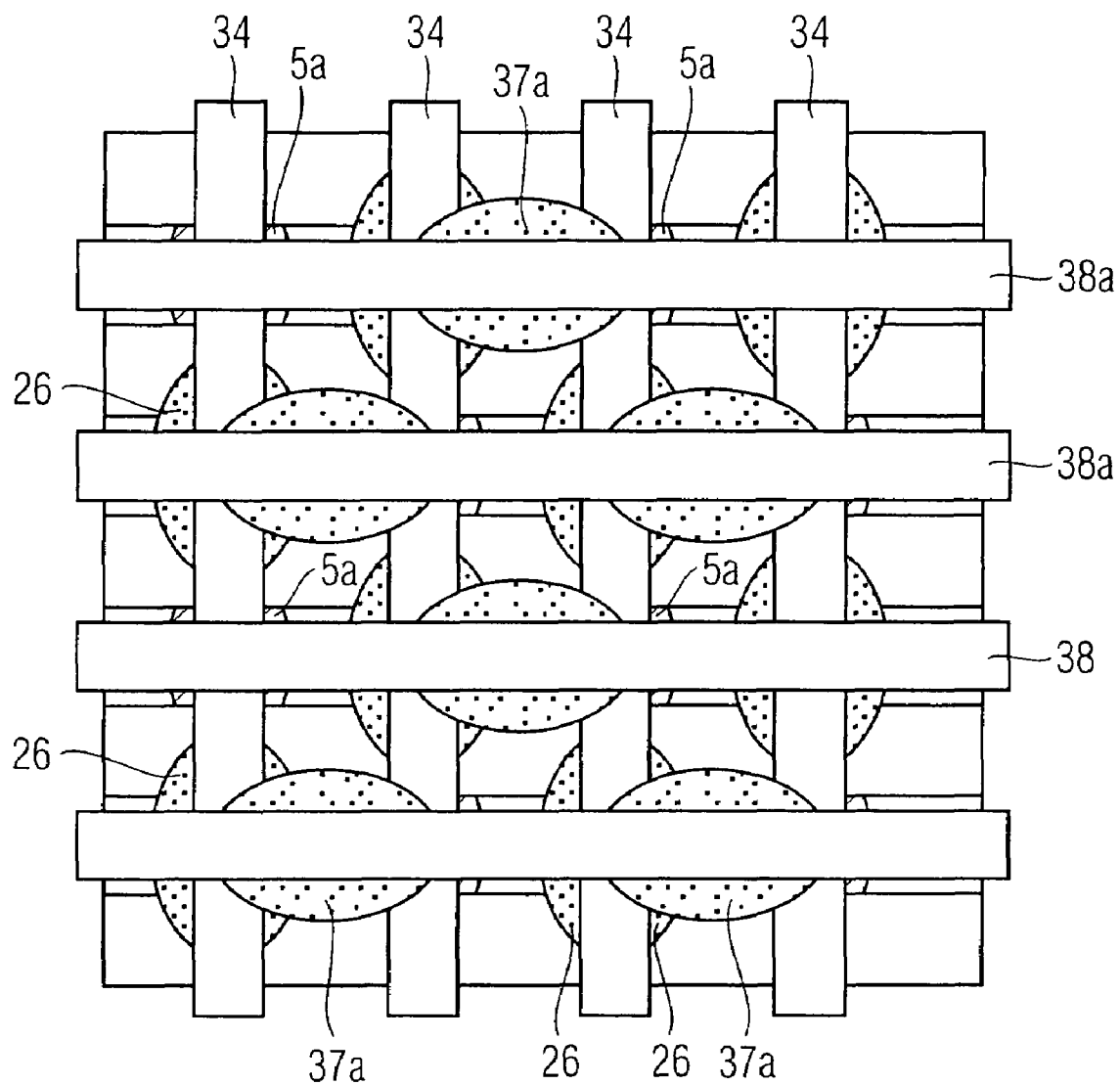

FIG. 10 illustrates a plan view of the memory cell array according to the invention after the bit line regions 38$a$ have been defined.

Compared to conventional memory cell arrays, the memory cell array according to the invention in addition to the word lines 34 now includes defined gate electrode regions 26 and 30.

A second exemplary embodiment is explained in more detail with reference to FIGS. 11 to 21. In accordance with the second exemplary embodiment, the storage capacitor is realized as a trench capacitor which is connected to the first source/drain region 18 of a select transistor via a surface strap 43, the select transistor being realized as a fin-FET. In this context, it should be noted that the storage capacitor may also be realized as a stacked capacitor, and in particular the connection of second capacitor electrode to the first source/drain region 18 of the select transistor may also be realized as a buried strap.

Figure 11:
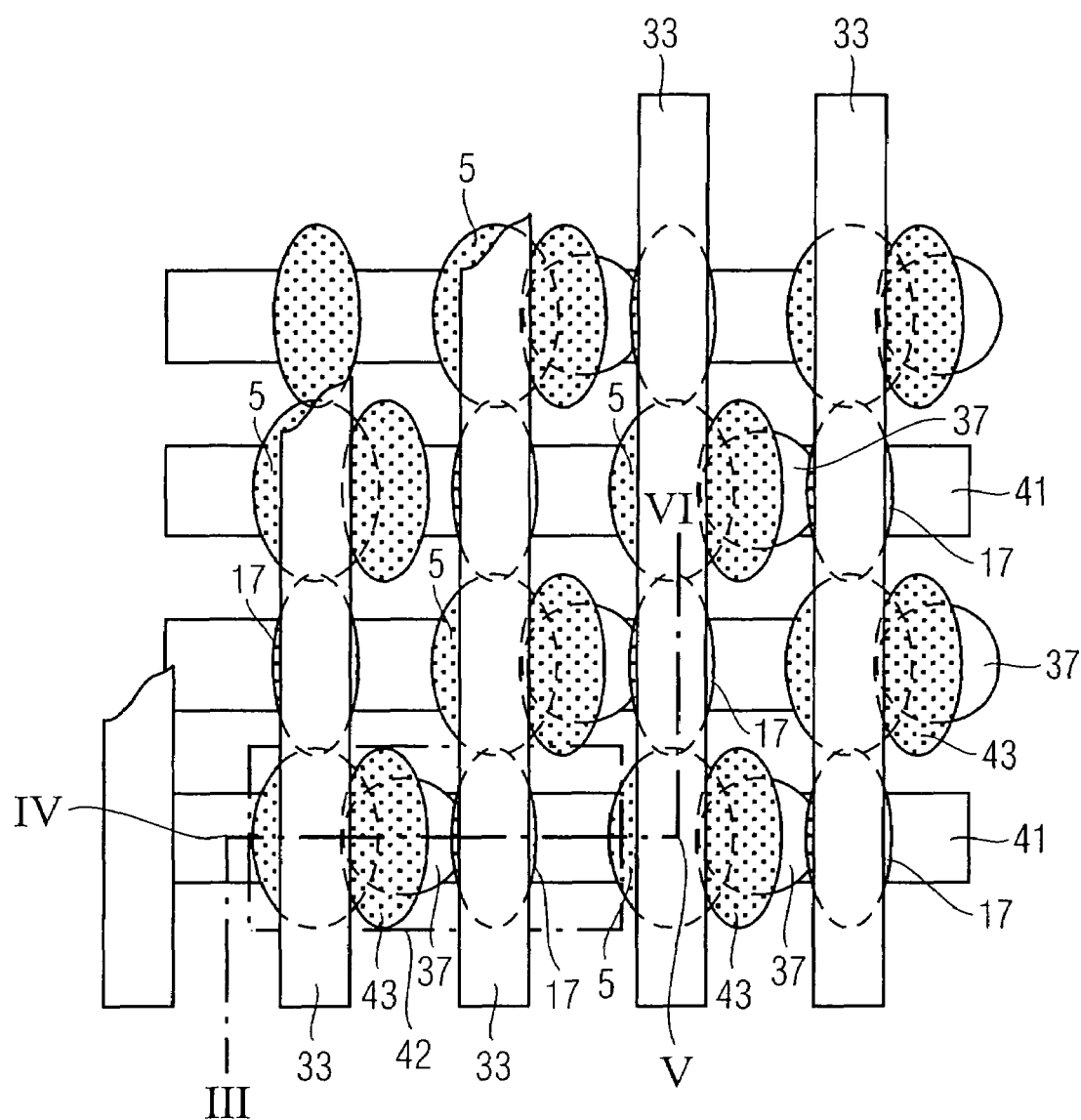
FIGS. 11-21 depict steps for fabricating a memory cell array in accordance with a second exemplary embodiment of the present invention, where

FIG. 11 illustrates a plan view of the memory cell array, which in this case is once again realized as a checkerboard array. However, other alternative layouts are of course also conceivable. FIG. 11 in particular illustrates the points along which the cross sections of the subsequent figures are taken. The section from III to IV runs between two adjacent word lines 33 towards the active area 41. The section from IV to V runs along an active area from a point arranged to the left of a trench capacitor to a point arranged in the centre of a trench capacitor, and the section from V to VI runs along a word line from a centre of a trench capacitor to a further centre of a trench capacitor, below the gate electrode of an adjacent memory cell.

FIG. 11 also illustrates the contour of a memory cell 42 comprising a storage capacitor and a select transistor. The area required for a memory cell of this type is 8 $F^2$, where F denotes the minimum feature size of the associated technology.

Figure 12:
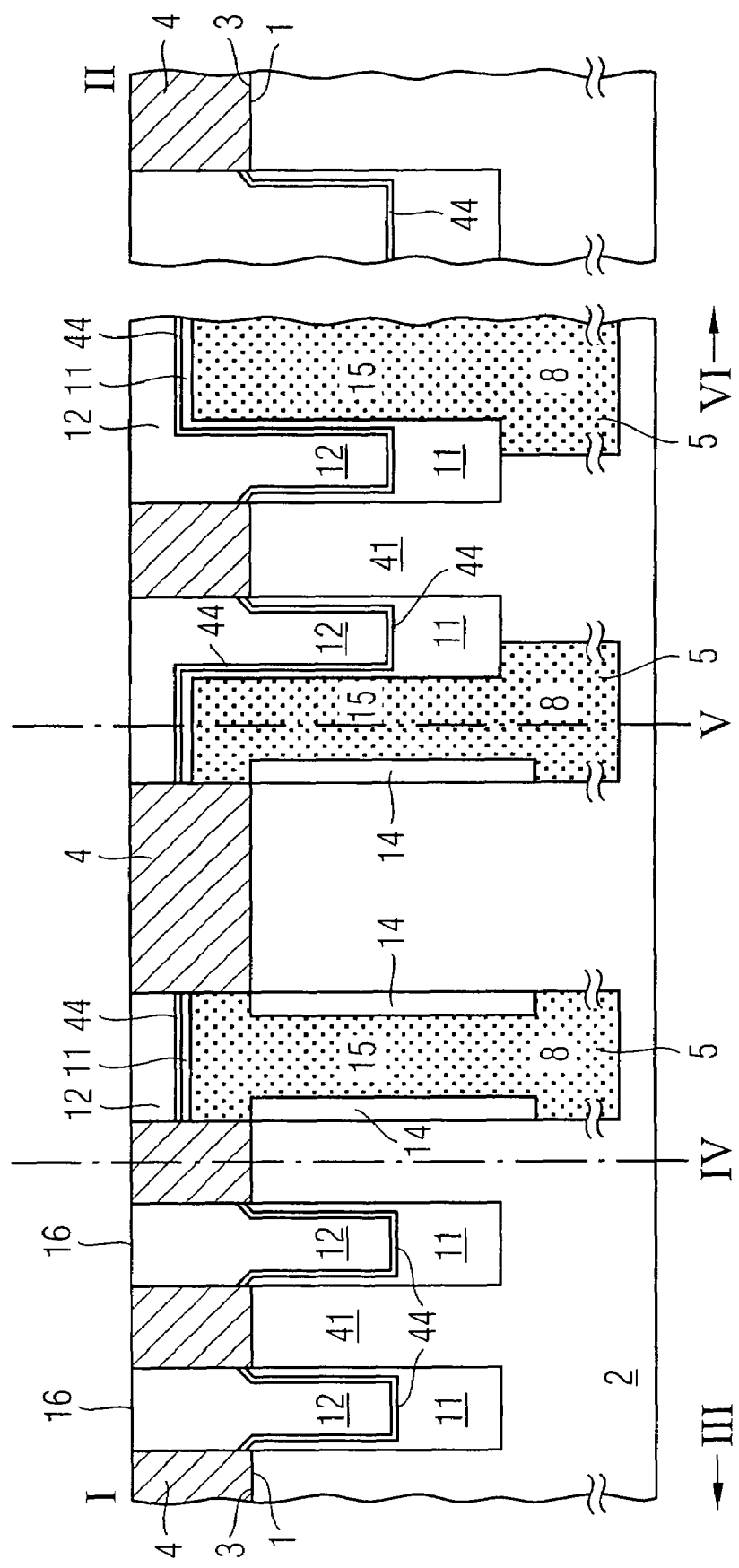
Figure 13:
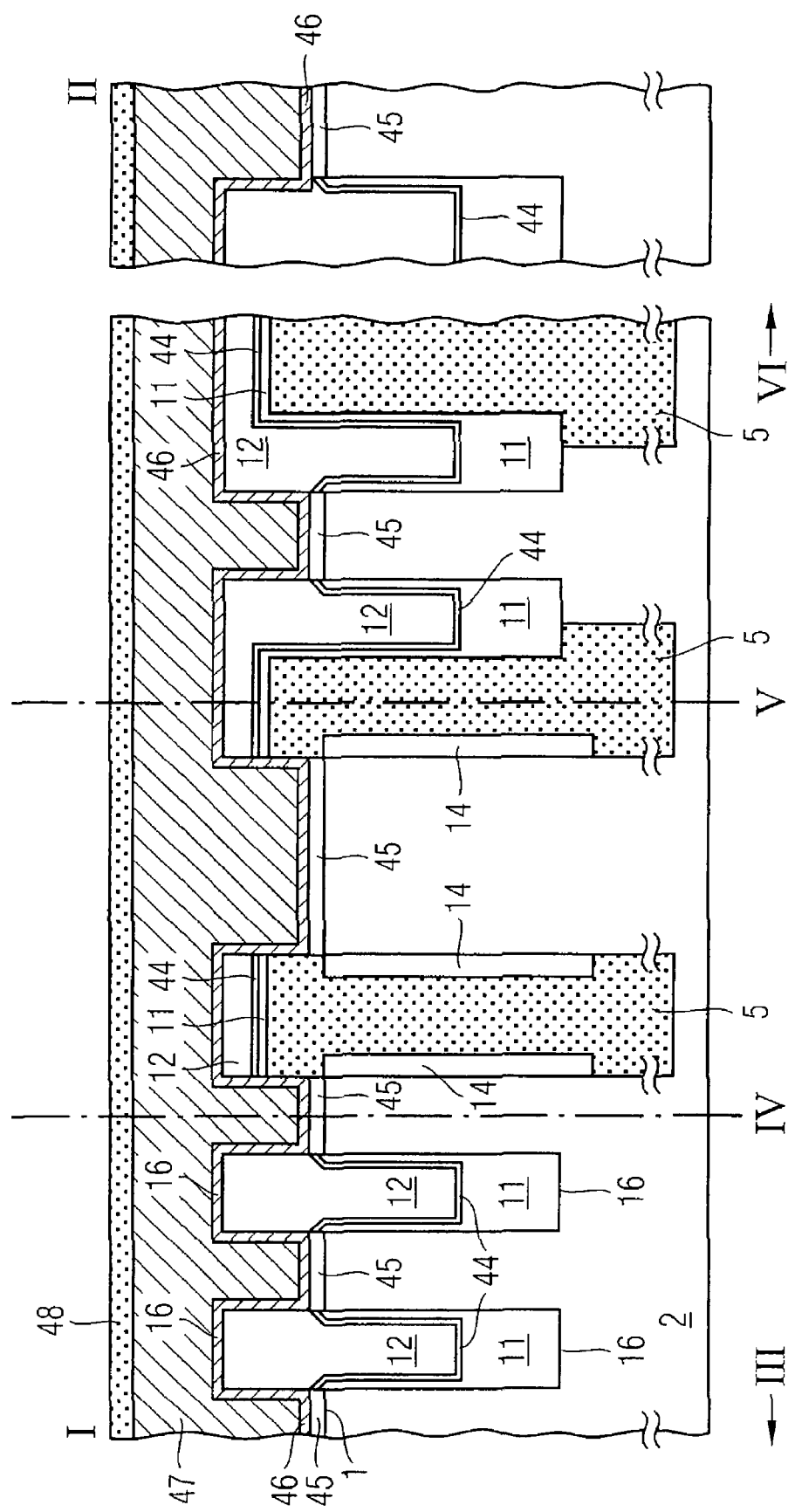
Figure 14:
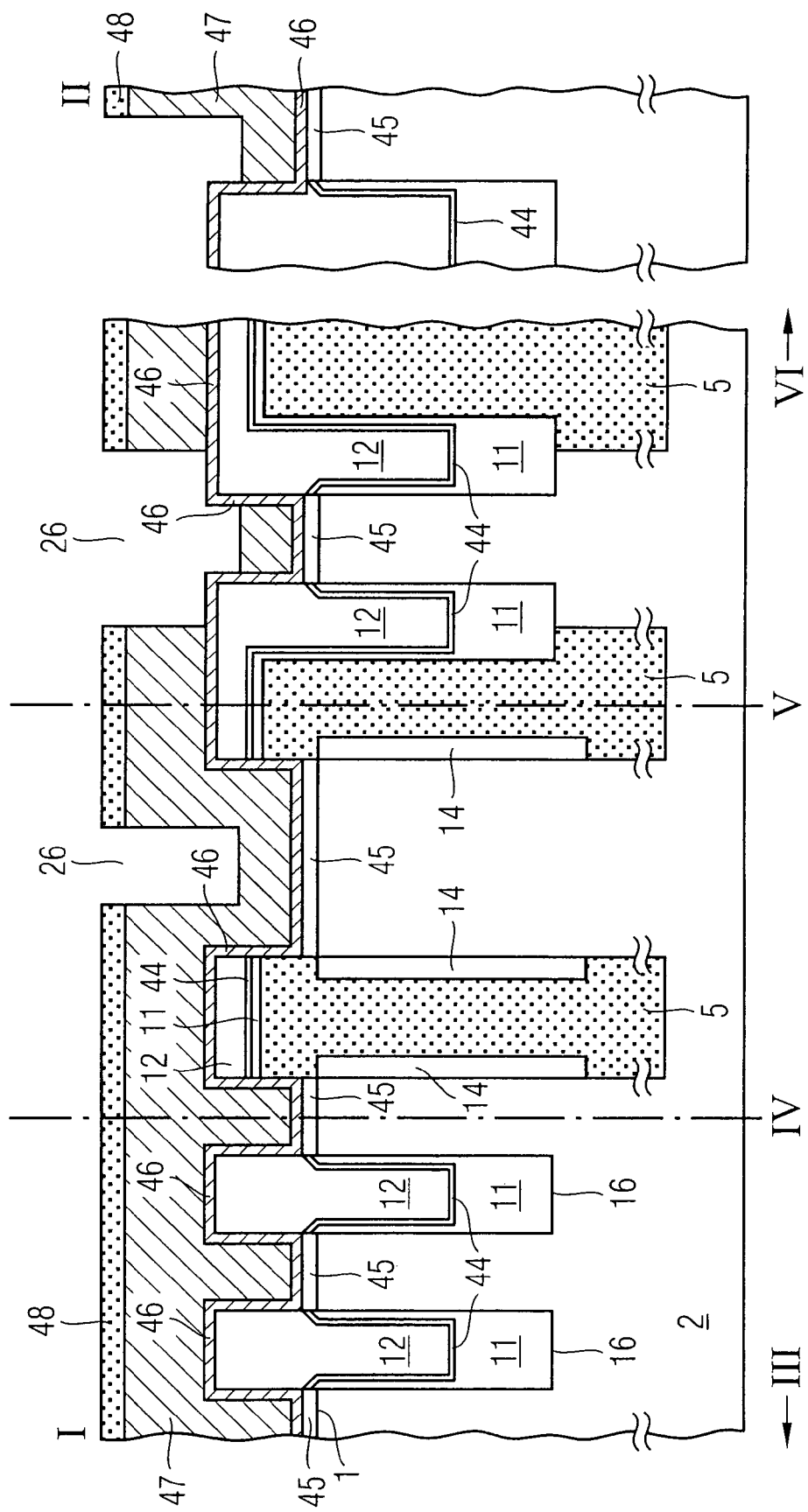
Figure 15:
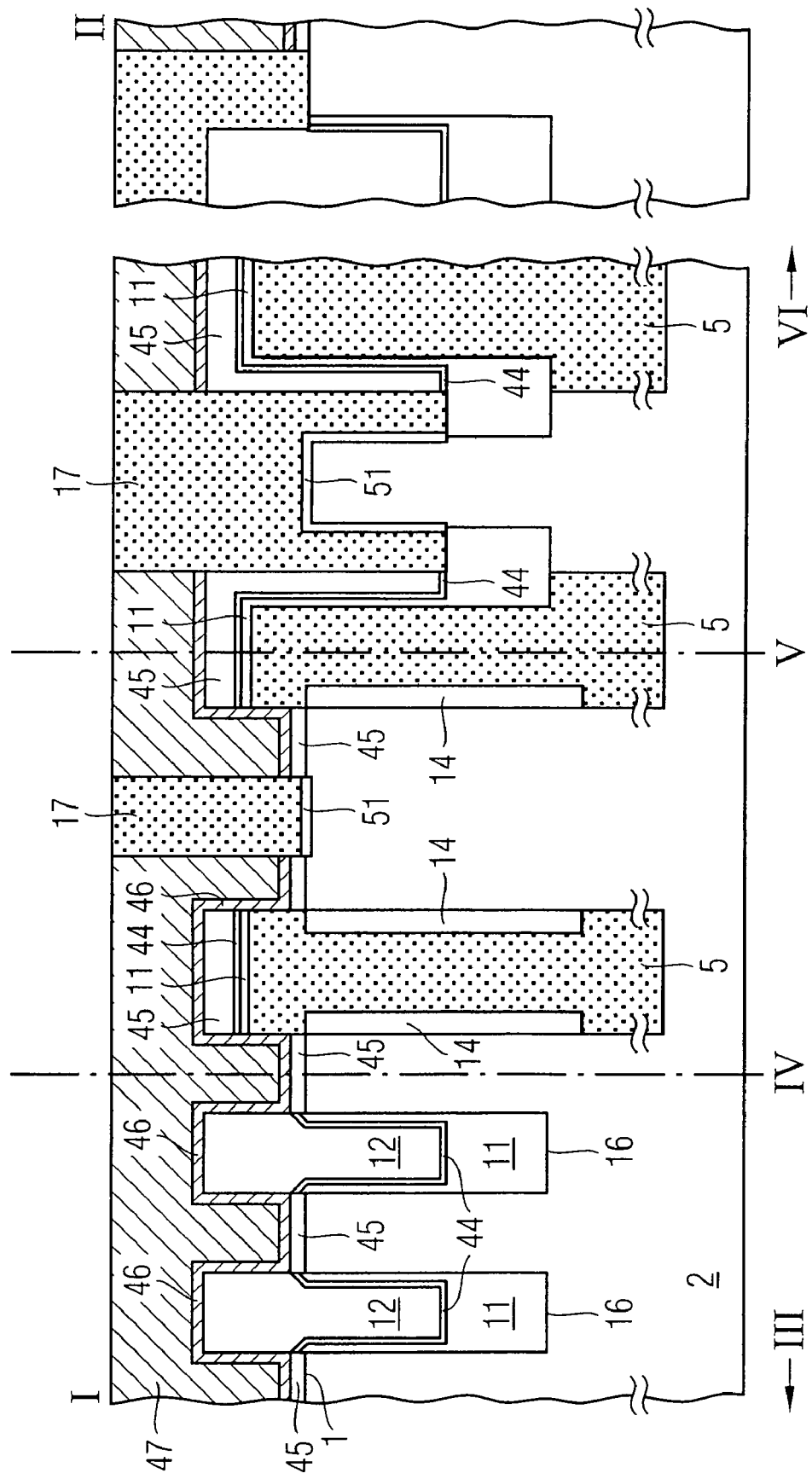
Figure 16:
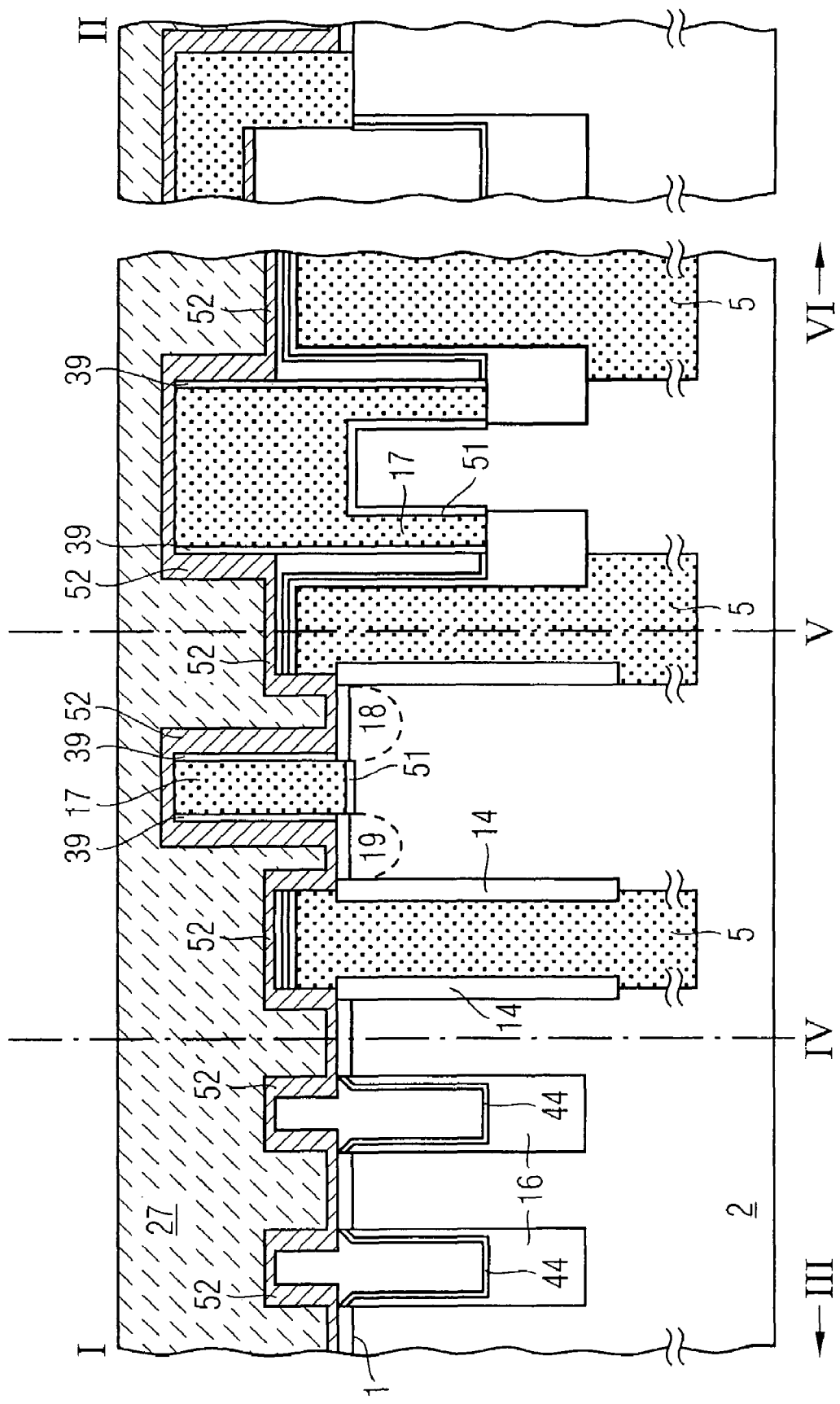
Figure 17:
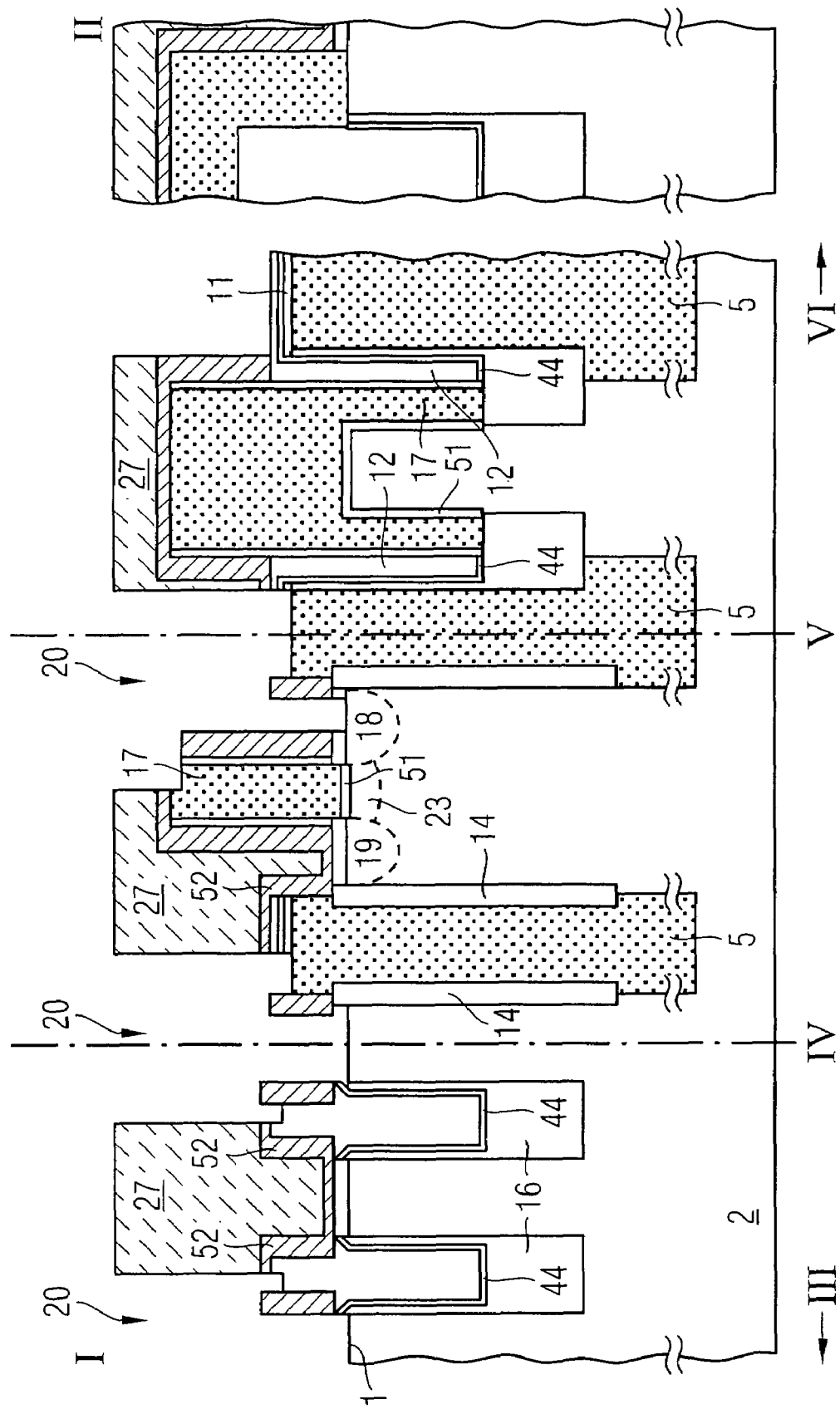
Figure 18:
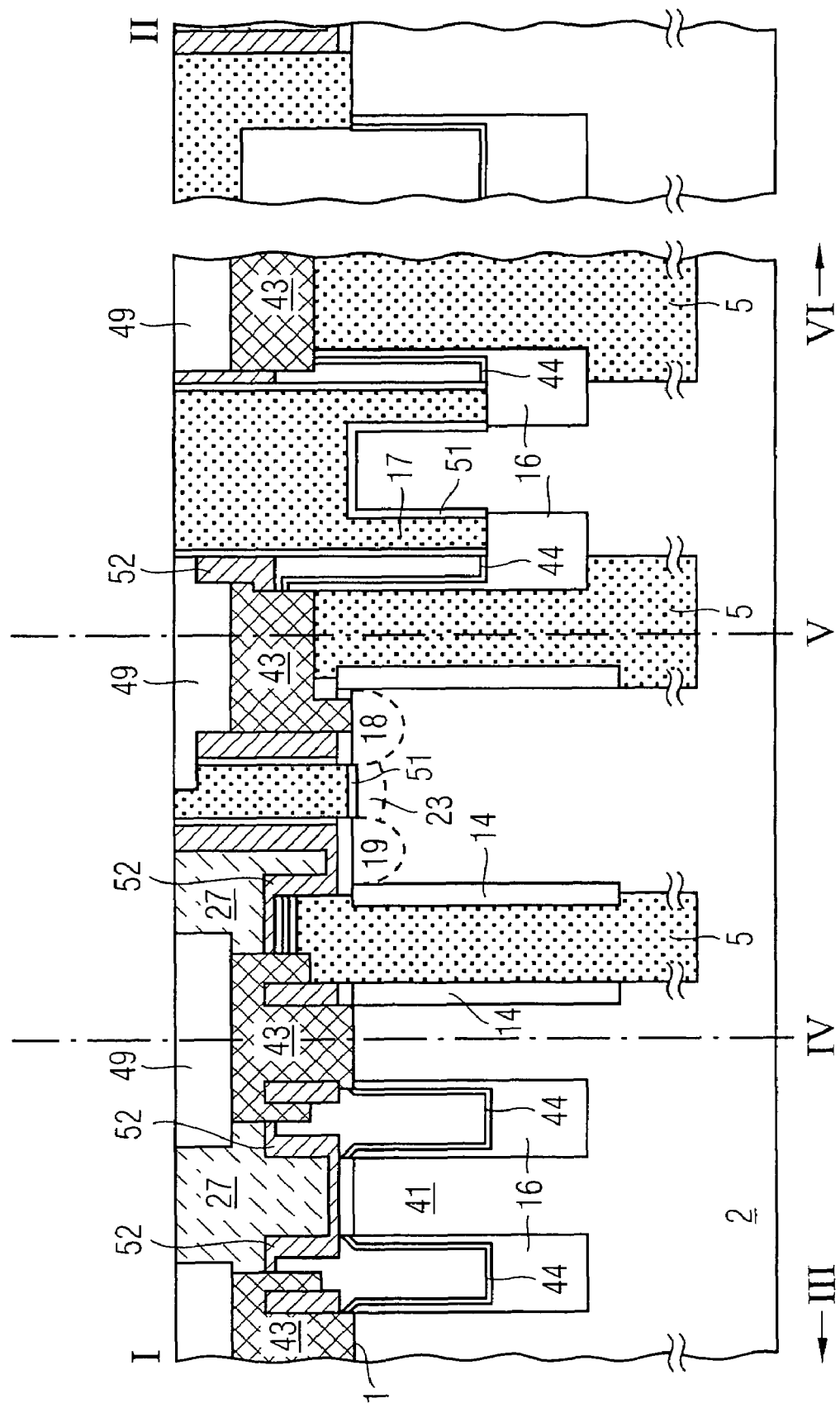
Figure 19:
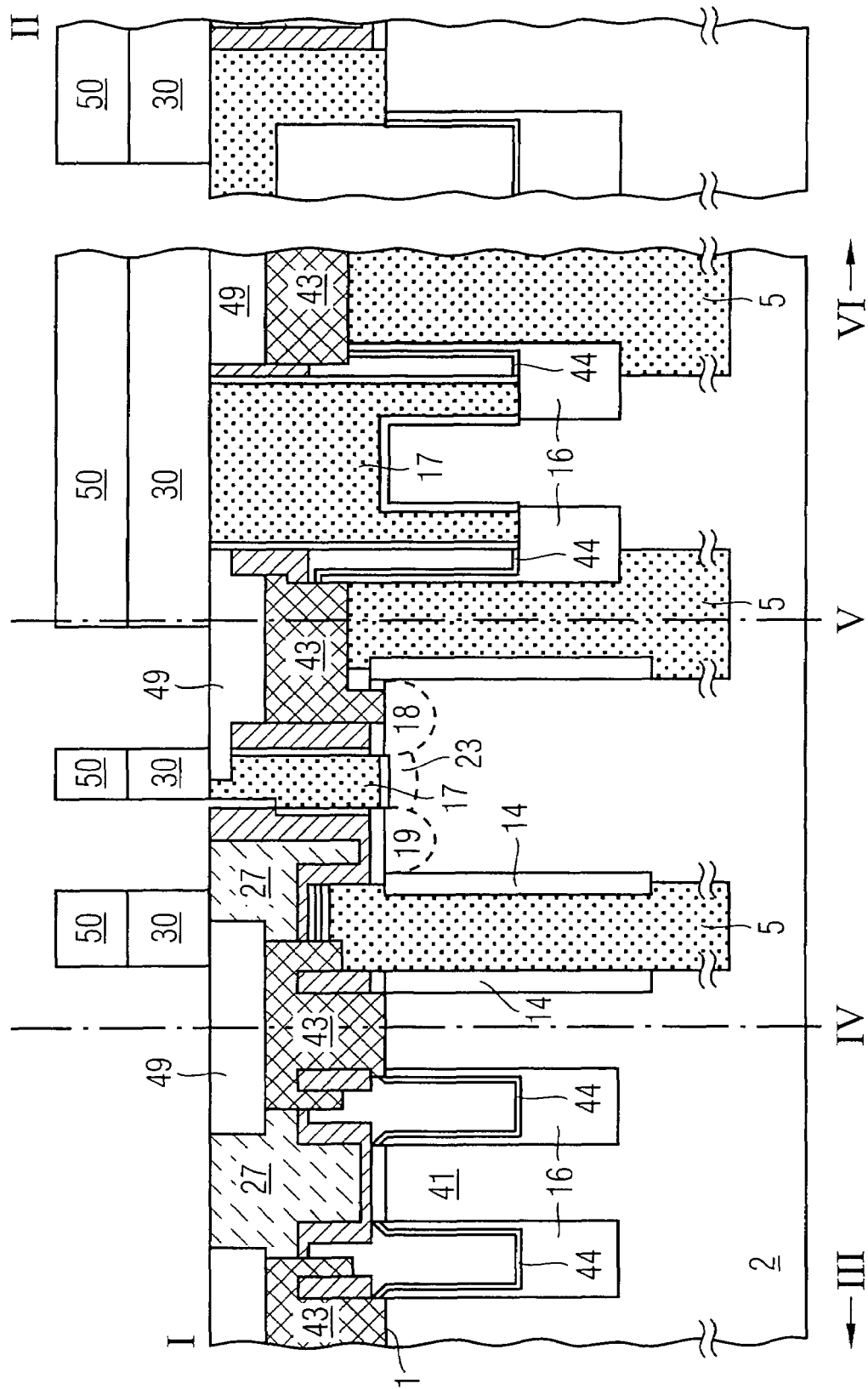
Figure 20:
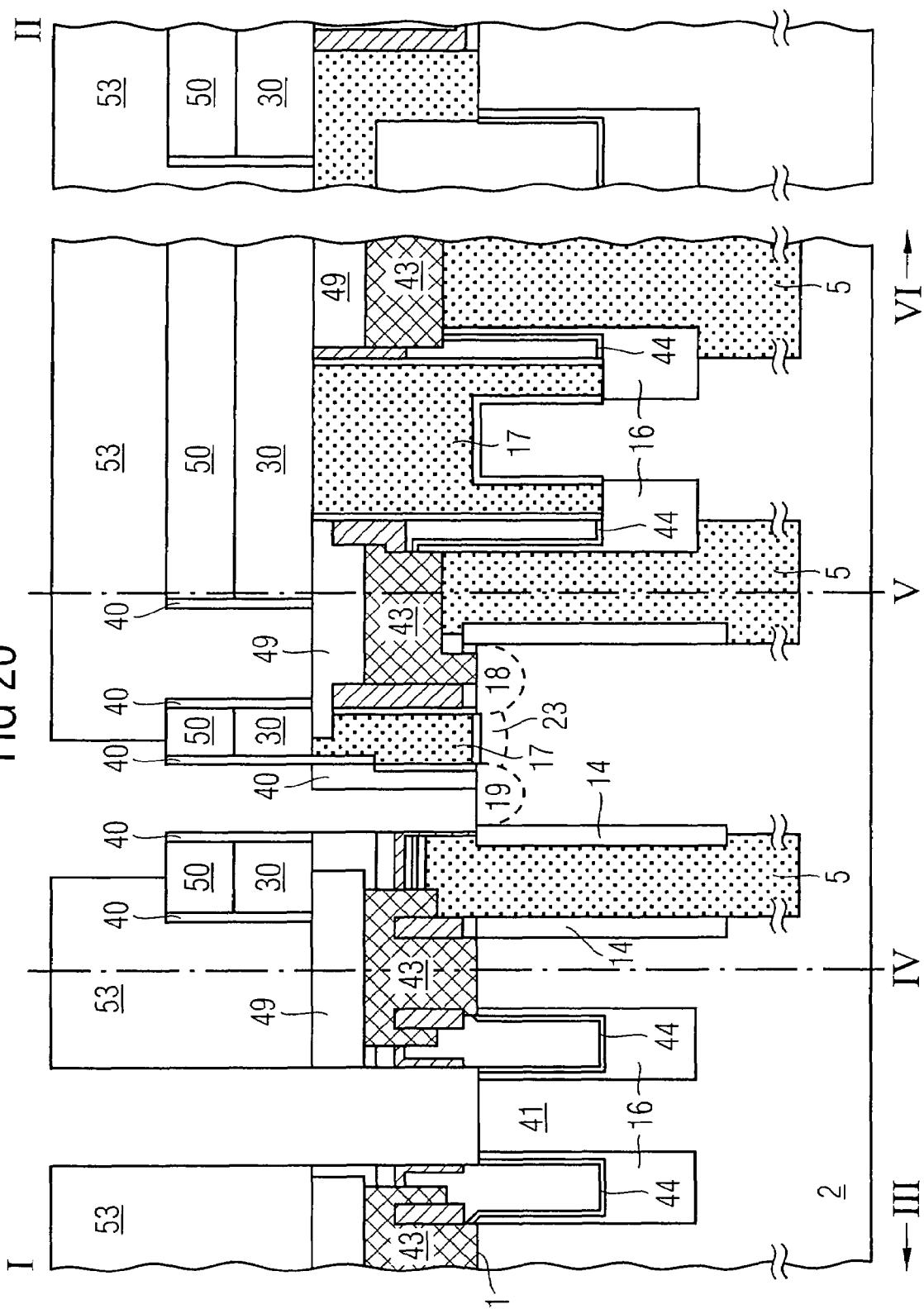

FIG. 12 shows the starting point for carrying out the method according to the invention in accordance with the second exemplary embodiment. To fabricate the structure shown in FIG. 12, first of all an $SiO_2$ layer 3 and an $Si_3N_4$ layer 4 are applied to the surface 1 of a semiconductor substrate 2 as hard mask layers using standard processes. After photolithographic patterning of the capacitor trenches, these trenches are etched in the substrate surface using known processes, and then the first capacitor electrode (not shown), the capacitor dielectric (not shown) and the second capacitor electrode 8 are produced from n-doped polysilicon. Then, an insulation collar 14 is produced by standard processes and a further n-doped polysilicon filling 15 is deposited. The polysilicon filling 15 may in this case have the same doping as the polysilicon layer 8, but may also differ therefrom and may in particular comprise a different material.

Then, following a planarization step, the active areas 41 are defined by insulation structures 16 being photolithographically defined. The insulation structures are then etched as trenches, thermally oxidized in order to provide a very good surface in which no leakage currents occur, and then the isolation trenches 16 are filled.

The filling of the isolation trenches may, for example, be achieved by deposition of an $SiO_2$ layer by a HDP (high density plasma) deposition process, etching back the $SiO_2$ layer, depositing an $Si_3N_4$ layer 44, which is used for depth control during the subsequent step for etching trenches for the gate electrode, and filling the trenches with a further $SiO_2$ layer. The insulation structures 16 are arranged in such a manner that the region from IV to V runs completely within the active area 41. The surface is planarized after the filling has been introduced into the isolation trenches.

In FIG. 12, the region denoted by I illustrates the array region, while the region denoted by II illustrates the support region. More accurately, the left-hand part of FIG. 12 is the memory cell region while the right-hand part of FIG. 12 is the peripheral region, in which in particular the driving circuits are realized.

In a following step, the wafer is briefly immersed in HF in order to remove any silicon dioxide layer which may have formed. Then, the $Si_3N_4$ layer 4 is removed using known processes and an $Si_2$ sacrificial layer 45 is produced on the resulting substrate surface by a furnace process. This is followed by the well implantations which are carried out in the usual way, for example to define the region 5 in the semiconductor substrate 2. In the next step, a further $Si_3N_4$ layer 46 is applied as a liner layer; this layer may even fill the region between two adjacent insulation structures 16. Then, a further $SiO_2$ layer 47 is deposited by a TEOS process. Next, a thin mask layer 48 of polysilicon is applied using known processes. The result is the structure shown in FIG. 13.

In a following step, the regions in which the respective gate electrode 17 is to be formed are uncovered. First of all, the corresponding openings are defined photolithographically using a perforated mask for the gate regions. Then, the openings 26 are etched into the polysilicon layer 48 and the $SiO_2$ layer 47. The etching depth is in this case such that it stops approximately at the level of the height illustrated in FIG. 12 following the etching of the $SiO_2$ filling in the isolation trenches 16. More specifically, the etching is stopped at the $Si_3N_4$ layer 46. The fact that the $Si_3N_4$ layer has been reached can be recognized from an end point signal.

Then, the support region II is covered with a blocking mask in order to prevent a fin-FET from being formed in this region. Next, the $Si_3N_4$ layer 46 in the memory cell area I is etched further, and then the photoresist layer in the support region II is removed. The result is the structure shown in FIG. 14.

Next, an oxide etch which is selected with respect to $Si_3N_4$ is carried out, with the result that the opened regions 26 are continued all the way to the $Si_3N_4$ layer 46. Next, the $Si_3N_4$ layer 46 and the $SiO_2$ sacrificial layer 45 below it, as well as the thin oxide layer on the active area, are removed. In a following step, the $SiO_2$ material 12 which has now been uncovered is anisotropically etched selectively with respect to $Si_3N_4$ until the $Si_3N_4$ layer 44 has been reached. Then, the uncovered part of the $Si_3N_4$ layer 44 is removed, and the uncovered material of the $SiO_2$ filling 11 is removed at the flanks.

In a following step, a gate oxide layer 51 is produced conformally by a furnace process. Next, polysilicon is deposited as material for the gate electrode 17 and is planarized as far as the surface of the $SiO_2$ layer 47. The result is the structure shown in FIG. 15.

On account of the fact that during the processing steps described above the openings 26 for the gate electrodes are in each case etched only at the regions defined by the perforated mask, adjacent word lines can be particularly effectively insulated from one another.

In a following step, the oxide layer 47 is etched by wet-chemical means down to the $Si_3N_4$ layer 46. Then, the $Si_3N_4$ layer 46 and the $SiO_2$ sacrificial layer 45 beneath it are removed using known processes. A side wall oxide layer 39 is produced on each of the side walls of the gate electrodes by a thermal oxidation process. Then, an implantation step is carried out to define the source/drain regions. Next, an $Si_3N_4$ spacer layer 52 is deposited using known processes, and after that a subsequent implantation step is carried out to define the source/drain regions. After a further $Si_3N_4$ layer has been deposited, a BPSG filling 27 is applied and planarized above the polysilicon using known processes. The result is the structure shown in FIG. 16.

In a following step, the surface regions for providing the surface strap 43 are patterned. For this purpose, first of all the surface strap region is defined photolithographically using known processes, and then the BPSG layer 27 is etched selectively with respect to silicon nitride and silicon. Then, the $Si_3N_4$ layers 52, 44 and the $SiO_2$ layer 11 are etched at the uncovered regions. At this point, it is optionally possible for the uncovered source/drain regions, at which the surface strap is subsequently also to be formed, to be used to produce a spatially elevated source/drain region by carrying out a selective epitaxy process and doping this epitaxially grown region by implantation. If this optional process step is not carried out, the result is the structure shown in FIG. 17.

Then, the $SiO_2$ layer 11 arranged above the capacitor trenches 50 is etched and a TiN liner layer (not shown) is deposited. Next, the material for the surface strap 43, for example tungsten or polysilicon, is deposited and etched back using known processes. Then, the remaining $SiO_2$ regions are removed and an $Si_3N_4$ layer 49 is deposited. This is etched back in order to uncover the regions above the gate electrodes 17. Then, depending on the topology which is formed, a planarization step is carried out, stopping at the nitride cap 49. The result is the structure shown in FIG. 18.

In a subsequent step, the word lines are defined by a reactive ion etching process. For this purpose, first of all the material for the word lines is deposited. In the present case, the word lines are composed of a TiN layer 30 and an $Si_3N_4$ layer 50. Alternatively, the low-resistance part of the word lines may also be composed of a TiN/W layer stack or a polysilicon/WSi layer stack. After this layer stack has been applied over the entire surface, the word lines are photolithographically patterned using known processes and etched, this step being carried out in such a way that in the region between IV and V the left-hand part of the gate electrodes 17 is slightly overetched. The result is the structure shown in FIG. 19.

In a following step, a silicon nitride layer is applied to the word lines using known processes and etched, resulting in a spacer layer 40. Then, an $SiO_2$ layer 53 is applied over the entire surface. The bit line contacts are then first photolithographically defined in this $SiO_2$ layer 53 using known processes and then etched. The result is the structure shown in FIG. 20.

In a following step, it is optionally possible for a single-crystal silicon layer 53 to be produced at the contact region with the second source/drain region by means of a selective epitaxy process and then for this single-crystal silicon layer 53 to be doped by ion implantation. An optional step of this nature allows a larger contact surface to be provided between bit line contact and second source/drain regions. Furthermore, contacts are etched in the support region II.

Thereafter, the bit line contact 37 is completed by depositing a TiN liner layer and tungsten. Next, the M0 metallization level is completed using known processes by applying a bit line material and patterning the bit lines 38. The result is the structure illustrated in FIG. 21.

Figure 21:
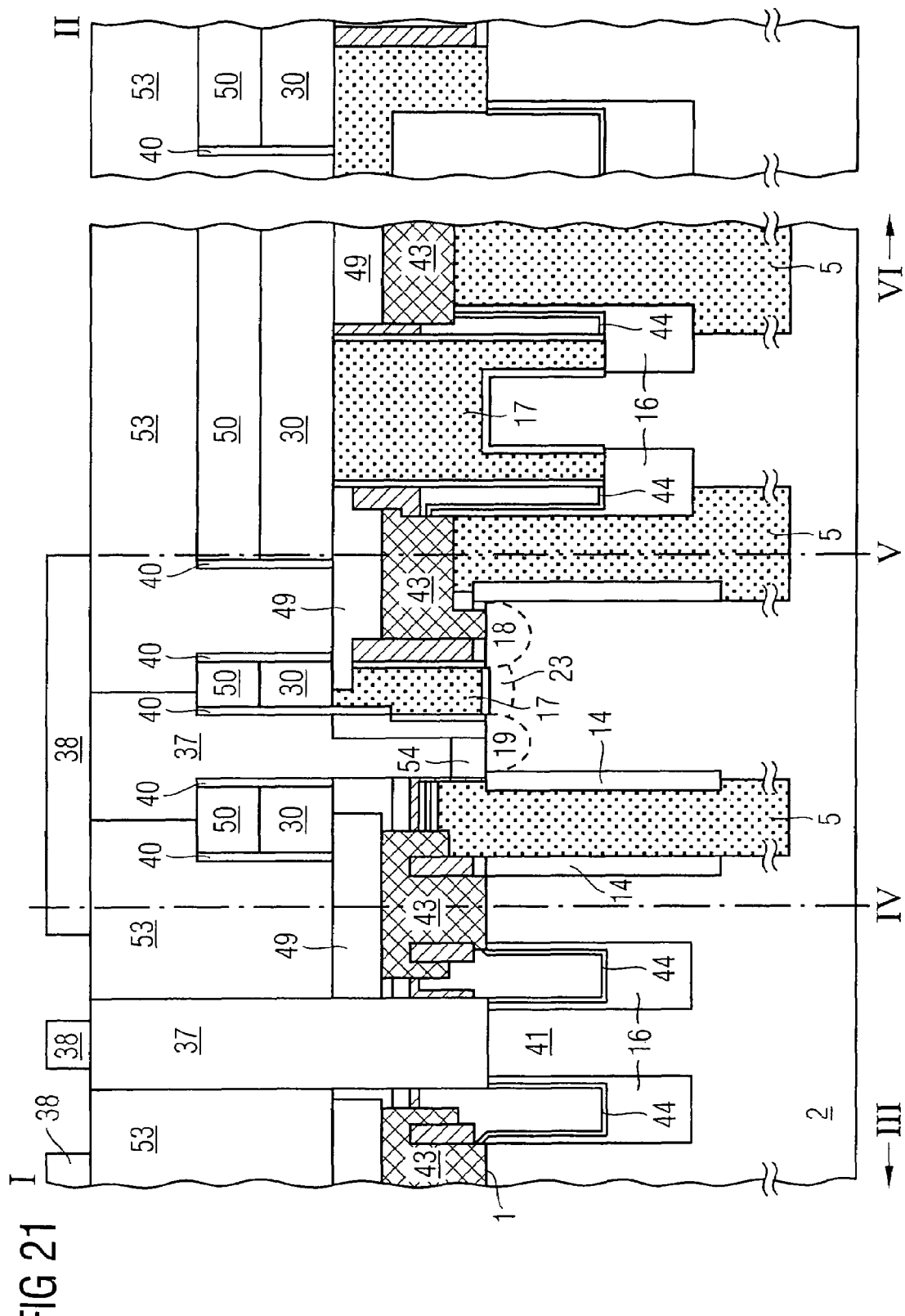

In FIG. 21, the region illustrated between IV and V represents the cross section through an active area 41. Charge stored in the right-hand trench capacitor 5 is passed via the surface strap 43 to the first source/drain region 18, and the conductive channel is formed between the first source/drain region 18 and the second source/drain region 19. The conductivity of the channel is controlled by the gate electrode 17, which for its part is conductively connected to the word lines 30. The stored information can be read across the bit line 38 via the epitaxially grown silicon region 54 and the bit line contact 37.

As can be seen in FIG. 21, the gate electrode plane 17 and the word line plane 30 are clearly separated from one another. In particular, the word line 30 is arranged at a different level from the gate electrode 17.

The specific configuration of the select transistor 9 as a fin-FET can be seen from the section between V and VI. The section between V and VI runs below a word line. As is clearly evident, the active area between the two isolation trenches 16 is designed in fin form and is surrounded by the gate electrodes 17 on three sides.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. An integrated circuit that comprises a memory cell array, the memory cell array comprising:
    a plurality of memory cells that are at least partially formed in a semiconductor substrate, each of the memory cells comprising a storage capacitor, a select transistor including a channel region and a gate electrode, wherein the gate electrode surrounds at least two sides of the channel region, each select transistor including first and second source/drain regions that are oriented such that a flow of current through each channel region includes a portion that is substantially horizontal with respect to a top surface of the semiconductor substrate; and
    a plurality of word lines, the word lines being connected to the gate electrodes;
    wherein, in a cross section of the memory cell array through each channel region, a bottom edge of the gate electrode surrounding at least two sides of the channel region is disposed at a distance from the top surface of the semiconductor substrate that is different in relation to a distance of the bottom edges of the word lines from the top surface of the semiconductor substrate.

2. An integrated circuit comprising a memory cell array, the memory cell array comprising:
    a plurality of memory cells that are at least partially formed in a semiconductor substrate, each of the memory cells comprising a storage capacitor, a select transistor including a channel region and a gate electrode, wherein the gate electrode surrounds at least two sides of the channel region, each select transistor including first and second source/drain regions that are oriented such that a flow of current through each channel region includes a portion that is substantially horizontal with respect to a top surface of the semiconductor substrate; and
    a plurality of word lines, the word lines being connected to the gate electrodes;
    wherein, in a cross section of the memory cell array through each channel region, a bottom edge of the gate electrode surrounding at least two sides of the channel region is disposed at a distance from a top surface of the semiconductor substrate that is different in relation to a distance of the bottom edges of the word lines from the top surface of the semiconductor substrate.

3. The integrated circuit of claim 2, wherein the memory cells are arranged in cell rows and cell columns, the storage capacitors and select transistors are arranged in a checkerboard pattern, each select transistor being assigned to a respective diagonally adjacent first field and each storage capacitor being assigned to a respective intervening and diagonally adjacent second field.

4. The integrated circuit of claim 2, wherein the memory cells are arranged in cell rows and cell columns, and each storage capacitor is arranged in an adjacent pair with a corresponding select transistor such that at least two adjacent memory cells are assigned to a common bit line contact.

5. The integrated circuit of claim 2, wherein at least one storage capacitor comprises a trench capacitor formed in a trench within the substrate.

6. The integrated circuit of claim 2, wherein at least one storage capacitor comprises a stacked capacitor.

7. The integrated circuit of claim 2, wherein a second capacitor electrode of the storage capacitor is connected to a first source/drain region of the select transistor for each memory cell via a connecting region disposed within the semiconductor substrate.

8. The integrated circuit of claim 2, wherein a second capacitor electrode of the storage capacitor is connected to a first source/drain region of the select transistor for each memory cell via a connecting region disposed above the top surface of the semiconductor substrate.

9. The integrated circuit of claim 2, wherein each gate electrode is substantially U-shaped in cross-section and suffounds three sides of the corresponding conductive channel region.

10. The integrated circuit of claim 2, wherein each gate electrode comprises polysilicon.

11. The integrated circuit of claim 2, wherein each wordline comprises one of tungsten and tungsten silicide.

12. An integrated circuit comprising a memory cell array, the memory cell array comprising:

a plurality of memory cells that are at least partially formed in a semiconductor substrate, each memory cell including a gate electrode and a select transistor that includes a channel region and first and second source/drain regions that are oriented such that a flow of current through each channel region includes a portion that is substantially horizontal with respect to a top surface of the semiconductor substrate, wherein the gate electrode is at least partially disposed within the semiconductor substrate; and a plurality of wordlines that are connected to the gate electrodes, wherein a bottom edge of each of the gate electrodes is disposed at a distance from a top surface of the semiconductor substrate that is different in relation to a distance of the bottom edges of the word lines from the top surface of the semiconductor substrate.

13. The integrated circuit of claim 12, wherein the wordlines comprise an electrically conductive material that is different from an electrically conductive material of the gate electrodes.

14. The integrated circuit of claim 12, wherein each memory cell includes a select transistor including a channel region, and the gate electrode has a substantially U-shaped cross-section and is oriented to surround three sides of the corresponding channel region.

15. The integrated circuit of claim 12, wherein each gate electrode comprises polysilicon.

16. The integrated circuit of claim 12, wherein each wordline comprises one of tungsten and tungsten silicide.

17. An integrated circuit comprising a memory cell array, the memory cell array comprising:

a plurality of memory cells that are at least partially formed in a semiconductor substrate, each of the memory cells comprising a transistor including a gate electrode and first and second source/drain regions, wherein the first and second source/drain regions are disposed adjacent a top surface of the semiconductor substrate and are oriented such that a flow of current through a channel region includes a portion that is substantially horizontal with respect to the top surface of the semiconductor substrate, and the gate electrode is at least partially disposed within the semiconductor substrate; and a plurality of wordlines that are connected to the gate electrodes;

wherein, in a cross section through at least one channel region of the memory cell array, a bottom edge of each gate electrode is disposed at a distance from a top surface of the semiconductor substrate that is different in relation to a distance of the bottom edges of the word lines from the top surface of the semiconductor substrate.

18. The integrated circuit of claim 17, wherein the word lines comprise an electrically conductive material that is different from an electric ally conductive material of the gate electrodes.

19. The integrated circuit of claim 17, wherein each gate electrode is substantially U-shaped in cross-section and surrounds three sides of a corresponding channel region.

20. The integrated circuit of claim 17, wherein the at least one channel region is arranged in a fin-like semiconductor substrate region.

21. The memory cell array integrated circuit of claim 17, wherein each gate electrode comprises polysilicon.

22. The integrated circuit of claim 17, wherein each wordline comprises one of tungsten and tungsten silicide.

23. The integrated circuit of claim 2, wherein the word lines comprise an electrically conductive material that is different from an electrically conductive material of the gate electrodes.

* * * * *